(12) United States Patent
Kuroda et al.

(10) Patent No.: US 11,251,055 B2
(45) Date of Patent: Feb. 15, 2022

(54) TEMPORARY PROTECTIVE FILM FOR SEMICONDUCTOR ENCAPSULATION MOLDING, LEAD FRAME PROVIDED WITH TEMPORARY PROTECTIVE FILM, ENCAPSULATED MOLDED BODY PROVIDED WITH TEMPORARY PROTECTIVE FILM, AND METHOD FOR MANUFACTURING SEMICONDUCTOR DEVICE

(71) Applicant: HITACHI CHEMICAL COMPANY, LTD., Tokyo (JP)

(72) Inventors: Takahiro Kuroda, Tokyo (JP); Tomohiro Nagoya, Tokyo (JP); Naoki Tomori, Tokyo (JP)

(73) Assignee: Showa Denko Materials Co., Ltd., Tokyo (JP)

(*) Notice: Subject to any disclaimer, the term of this patent is extended or adjusted under 35 U.S.C. 154(b) by 0 days.

(21) Appl. No.: 16/979,781

(22) PCT Filed: Mar. 1, 2019

(86) PCT No.: PCT/JP2019/008205
§ 371 (c)(1),
(2) Date: Sep. 10, 2020

(87) PCT Pub. No.: WO2019/176596
PCT Pub. Date: Sep. 19, 2019

(65) Prior Publication Data
US 2021/0020460 A1  Jan. 21, 2021

(30) Foreign Application Priority Data
Mar. 13, 2018 (JP) .............................. JP2018-045824

(51) Int. Cl.
*H01L 21/56* (2006.01)
*C09J 7/25* (2018.01)
(Continued)

(52) U.S. Cl.
CPC .............. *H01L 21/568* (2013.01); *C09J 7/25* (2018.01); *C09J 7/35* (2018.01); *C09J 11/06* (2013.01);
(Continued)

(58) Field of Classification Search
CPC ... H01L 21/568; H01L 21/561; H01L 21/565; H01L 23/49503
See application file for complete search history.

(56) References Cited

U.S. PATENT DOCUMENTS

2006/0043607 A1* 3/2006 Matsuura .............. H01L 21/568
257/782

FOREIGN PATENT DOCUMENTS

JP    H5-129473 A    5/1993
JP    H10-012773 A   1/1998
(Continued)

*Primary Examiner* — Marc Anthony Armand
(74) *Attorney, Agent, or Firm* — Fitch, Even, Tabin & Flannery, LLP

(57) ABSTRACT

Disclosed is a temporary protective film for semiconductor sealing molding comprising: a support film; and an adhesive layer provided on one surface or both surfaces of the support film and containing a resin and a silane coupling agent, and the content of the silane coupling agent in the temporary protective film may be more than 5% by mass and less than or equal to 35% by mass with respect to the total mass of the resin.

16 Claims, 9 Drawing Sheets

(51) Int. Cl.
*C09J 7/35* (2018.01)
*C09J 11/06* (2006.01)
*C09J 201/02* (2006.01)
*H01L 23/495* (2006.01)
*H01L 23/00* (2006.01)

(52) U.S. Cl.
CPC .......... *C09J 201/02* (2013.01); *H01L 21/561* (2013.01); *H01L 21/565* (2013.01); *H01L 23/49503* (2013.01); *H01L 24/45* (2013.01); *H01L 24/85* (2013.01); *H01L 24/96* (2013.01)

(56) References Cited

FOREIGN PATENT DOCUMENTS

| | | |
|---|---|---|
| JP | 2003-249617 A | 9/2003 |
| JP | 2008-095063 A | 4/2008 |
| JP | 2016-196322 A | 11/2016 |
| KR | 10-2002-0044586 A | 6/2002 |
| KR | 10-2002-0060143 A | 7/2002 |
| KR | 10-2011-0097798 A | 8/2011 |
| WO | 2004/075293 A1 | 9/2004 |
| WO | 2007/164352 A1 | 1/2019 |

* cited by examiner

TEMPORARY PROTECTIVE FILM FOR SEMICONDUCTOR ENCAPSULATION MOLDING, LEAD FRAME PROVIDED WITH TEMPORARY PROTECTIVE FILM, ENCAPSULATED MOLDED BODY PROVIDED WITH TEMPORARY PROTECTIVE FILM, AND METHOD FOR MANUFACTURING SEMICONDUCTOR DEVICE

CROSS-REFERENCE TO RELATED APPLICATIONS

This application is a U.S. national phase application filed under 35 U.S.C. § 371 of International Application No. PCT/JP2019/008205, filed Mar. 1, 2019, designating the United States, which claims priority from Japanese Patent Application 2018-045824, filed Mar. 13, 2018, which are hereby incorporated herein by reference in their entirety.

TECHNICAL FIELD

The present invention relates to a temporary protective film for semiconductor sealing molding, a temporary protective film-attached lead frame, a temporary protective film-attached sealing molded body, and a method for producing a semiconductor device.

BACKGROUND ART

Conventionally, semiconductor packages having a structure in which a semiconductor element is adhered onto a die pad by means of an adhesive such as a silver paste, this is joined to a lead frame with a wire, and then the entirety is sealed while an outer lead for external connection is left, have been used. However, as there is a stronger demand for density increase, area reduction, thickness reduction, and the like in recent years, semiconductor packages having various structures have been suggested. Among them, for example, lead-on-chip (LOC) and chip-on-lead (COL) structures, and the like are available; however, there are limitations in view of area reduction and thickness reduction.

In order to solve these problems, a package having a structure in which only one surface (semiconductor element side) of the package is sealed, and a lead frame exposed at the rear surface is used for external connection, has been developed (Patent Literatures 1 and 2). Since a package having this structure does not have a lead frame protruded from the sealing resin, area reduction and thickness reduction can be promoted. As one of methods for producing a semiconductor device having this package structure, there is a production method including steps shown below.

(1) A step of attaching a temporary protective film for semiconductor sealing molding on one surface (rear surface) of a lead frame having a die pad and an inner lead;

(2) a step of mounting (adhering) a semiconductor element on a surface of the die pad, the surface being on the opposite side of the temporary protective film;

(3) a step of providing a wire that connects the semiconductor element and the inner lead;

(4) a step of forming a sealing layer that seals the semiconductor element and the wire, and thereby obtaining a sealing molded body having a lead frame, a semiconductor element, and a sealing layer; and (5) a step of peeling the temporary protective film from the sealing molded body.

In the production of semiconductor packages according to this method, defects such as that the sealing resin wraps around the rear surface of the lead frame at the time of sealing molding may occur. As a method for preventing such defects, a method of attaching a temporary protective film as an adhesive film for semiconductor to the rear surface of the lead frame, thereby protecting the lead frame rear surface, sealing molding the semiconductor element mounted on the lead frame front surface side, and then tearing off the temporary protective film, is known.

CITATION LIST

Patent Literature

Patent Literature 1: Japanese Unexamined Patent Application Publication No. H5-129473

Patent Literature 2: Japanese Unexamined Patent Application Publication No. H10-12773

SUMMARY OF INVENTION

Problems to be Solved by the Invention

Currently, with regard to semiconductor packaging, temperature increase for the assembly processing conditions (Cu wire bonding and reflow connection (Cu Clip connection or the like)) is in progress. Accordingly, in the step of peeling the temporary protective film from the sealing molded body, the temporary protective film is strongly adhered to the lead frame and the sealing layer, and the temporary protective film may be fractured and may not be peeled off.

Thus, it is an object of the present invention to provide a temporary protective film for semiconductor sealing molding that can be easily peeled off from a lead frame and a sealing layer without breaking.

Means for Solving the Problems

A first aspect of the present invention relates to a temporary protective film for semiconductor sealing molding to temporarily protect a lead frame during sealing molding of forming a sealing layer that seals a semiconductor element mounted on the lead frame, comprising: a support film; and an adhesive layer provided on one surface or both surfaces of the support film and containing a resin. It is desirable that when the temporary protective film is attached to a lead frame having a die pad and an inner lead such that the adhesive layer comes into contact with the lead frame, the 90-degree peel strength between the adhesive layer and the lead frame is 5 N/m or greater at 25° C. It is desirable that when the temporary protective film is attached to the lead frame such that the adhesive layer comes into contact with the lead frame, a semiconductor element is mounted on a surface of a die pad, the surface being on the opposite side of the temporary protective film, subsequently the semiconductor element, the lead frame, and the temporary protective film are heated, and then a sealing layer sealing the semiconductor element while being in contact with the adhesive layer is formed, the 90-degree peel strength between the adhesive layer and the lead frame as well as the sealing layer may be 600 N/m or less at 180° C.

It is desirable that the adhesive layer further contains a silane coupling agent, and the content of the silane coupling agent is more than 5% by mass and less than or equal to 35% by mass with respect to the total mass of the resin.

An aspect of the present invention relates to a temporary protective film for semiconductor sealing molding to temporarily protect a lead frame during sealing molding of forming a sealing layer that seals a semiconductor element mounted on the lead frame, comprising: a support film; and an adhesive layer provided on one surface or both surfaces of the support film and containing a resin and a silane coupling agent. It is desirable that the content of the silane coupling agent is more than 5% by mass and less than or equal to 35% by mass with respect to the total amount of the resin.

It is desirable that the silane coupling agent is a compound represented by the following Formula (I):

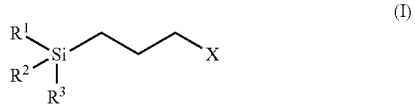

wherein $R^1$, $R^2$, and $R^3$ each independently represent an alkoxy group having 1 to 3 carbon atoms, an alkyl group having 1 to 6 carbon atoms, or an aryl group having 6 to 12 carbon atoms; X is represented by the following Formula (IIa), (IIb), (IIc), (IId), or (IIe):

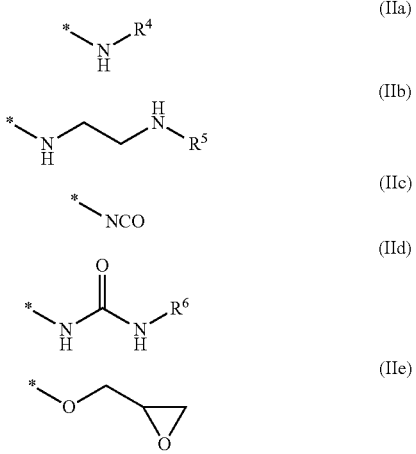

in these formulas, $R^4$, $R^5$, and $R^6$ each independently represent an alkyl group having 1 to 6 carbon atoms, an aryl group having 6 to 12 carbon atoms, or a hydrogen atom; and the symbol * represents a site of bonding to a carbon atom.

The glass transition temperature of the adhesive layer may be 100° C. to 300° C.

The resin may be a thermoplastic resin having an amide group, an ester group, an imide group, an ether group, or a sulfone group.

The elastic modulus at 200° C. of the adhesive layer may be 1 MPa or higher.

The ratio of the thickness of the adhesive layer with respect to the thickness of the support film may be 0.5 or less. The thickness of the adhesive layer may be 1 to 20 μm.

The support film may be a film of a polymer selected from the group consisting of an aromatic polyimide, an aromatic polyamide, an aromatic polyamideimide, an aromatic polysulfone, an aromatic polyethersulfone, a polyphenylene sulfide, an aromatic polyether ketone, a polyallylate, an aromatic polyether ether ketone, and polyethylene naphthalate.

The glass transition temperature of the support film may be 200° C. or higher. The thickness of the support film may be 5 to 100 μm.

The coefficient of linear expansion at 20° C. to 200° C. of the support film may be $3.0 \times 10^{-5}$ or less.

The shrinkage of the support film when heated at 200° C. for 60 minutes may be 0.15% or less.

It is desirable that an adhesive layer is provided on one surface of the support film, and the temporary protective film further includes a non-adhesive layer provided on a surface of the support film, the surface being the opposite side of the surface where the adhesive layer is provided.

An aspect of the present invention relates to a reel body including a winding core and the temporary protective film for semiconductor sealing molding wound around the wining core.

An aspect of the present invention relates to a package comprising the reel body; and a packaging bag accommodating the reel body.

An aspect of the present invention relates to a packing material, comprising the package; and a packing box accommodating the package.

An aspect of the present invention relates to a temporary protective film-attached lead frame, comprising: a lead flame having a die pad and an inner lead; and the temporary protective film, wherein the temporary protective film is attached to the lead frame in a direction in which the adhesive layer of the temporary protective film comes into contact with one surface of the lead frame.

An aspect of the present invention relates to a temporary protective film-attached sealing molded body, comprising: a lead frame having a die pad and an inner lead; a semiconductor element mounted on the die pad; a wire connecting the semiconductor element and the inner lead; a sealing layer sealing the semiconductor element and the wire; and the temporary protective film, wherein the adhesive layer of the temporary protective film is attached to a surface of the lead frame, the surface being on the opposite side of the surface where the semiconductor element is mounted.

An aspect of the present invention relates to a method for producing a semiconductor device, comprising, in the following order: a step of attaching the temporary protective film on one surface of a lead frame having a die pad and an inner lead, in a direction in which the adhesive layer of the temporary protective film faces the lead frame; a step of mounting a semiconductor element on a surface of the die pad, the surface being on the opposite side of the temporary protective film; a step of providing a wire for connecting the semiconductor element and the inner lead; a step of forming a sealing layer sealing the semiconductor element and the wire, and thereby obtaining a sealing molded body having a lead frame, a semiconductor element, and a sealing layer, and a step of peeling off the temporary protective film from the sealing molded body.

It is desirable that the lead frame has a plurality of die pads, and a semiconductor element is mounted on each of the plurality of die pads, and the method further comprises a step of dividing the sealing molded body before or after peeling off the temporary protective film from the sealing molded body, and thereby obtaining semiconductor devices each having one die pad and one semiconductor element.

Effects of the Invention

According to the present invention, there is provided a temporary protective film for semiconductor sealing molding that can be easily peeled off from a lead frame and a sealing layer without breaking.

Furthermore, the temporary protective film for semiconductor sealing molding of the present invention has a sufficient adhesive layer for a lead frame and has various characteristics needed for semiconductor sealing use applications, such as that curling, warping of the lead frame, and adhesive residue are suppressed.

EMBODIMENTS FOR CARRYING OUT THE INVENTION

Hereinafter, suitable embodiments of the present invention will be explained in detail. However, the present invention is not intended to be limited to the following embodiments. The upper limits and the lower limits of the value ranges described in the present specification can be arbitrarily combined. The values described in Examples can also be used as the upper limits or lower limits of value ranges.

<Temporary Protective Film>

Figure 1:
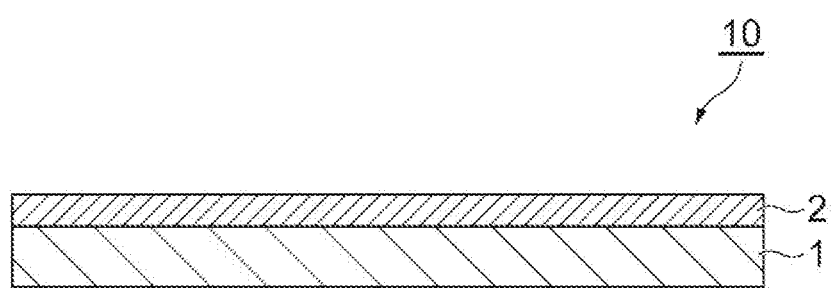
FIG. 1 is a cross-sectional view illustrating an embodiment of a temporary protective film.
Figure 2:
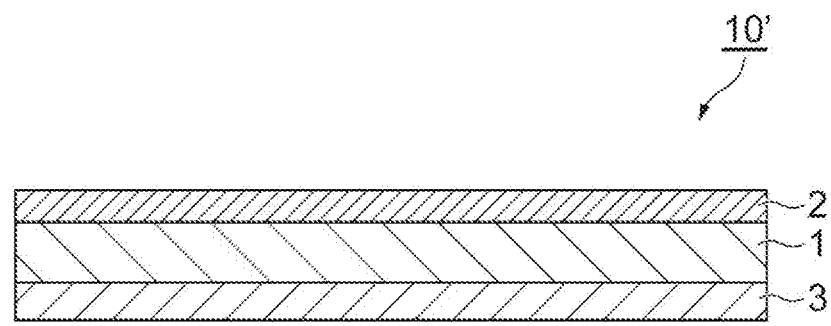
FIG. 2 is a cross-sectional view illustrating an embodiment of a temporary protective film.

FIG. 1 is a cross-sectional view illustrating a temporary protective film according to an embodiment. The temporary protective film 10 illustrated in FIG. 1 is composed of a support film 1 and an adhesive layer 2 provided on one surface of the support film 1. An adhesive layer may be formed on both surfaces of the support film 1. FIG. 2 is also a cross-sectional view illustrating the temporary protective film according to an embodiment. The temporary protective film 10' of FIG. 2 has a support film 1; an adhesive layer 2 provided on one of principal surfaces of the support film 1; and a resin layer (non-adhesive layer 3) that is provided on the other principal surface of the support film 1 and substantially does not have adhesiveness. These temporary protective films can be used, in a process for sealing molding of forming a sealing layer that seals a semiconductor element mounted on a lead frame, as temporary protective films for semiconductor sealing molding for temporarily protecting lead frames during sealing molding, by attaching a temporary protective film on the rear surface of the lead frame (surface on the side opposite to the surface where the semiconductor element is mounted).

When a temporary protective film is attached to a lead frame having a die pad and an inner lead such that the adhesive layer comes into contact with the lead frame, the 90-degree peel strength (peel strength after attachment) at 25° C. between the adhesive layer and the lead frame may be 5 N/m or more, may be 50 N/m or more, may be 100 N/m or more, and may be 150 N/m or more. In a case in which the peel strength after attachment is less than 5 N/m, there are problems such as that the temporary protective film is easily peeled off from the lead frame, and at the time of sealing molding, the sealing resin penetrates between the lead frame and the adhesive layer. The peel strength after attachment may be 2,000 N/m or less, may be 1,500 N/m or less, and may be 1,000 N/m or less.

The peel strength after attachment is measured by, for example, tearing off the temporary protective film in a 90-degree direction with respect to the lead frame according to the 90-degree tear-off method of JS Z 0237. Specifically, the 90-degree peel strength at the time of tearing off the temporary protective film at a speed of 270 to 330 mm per minute or 300 mm per minute at 25° C. is measured with a 90-degree peel testing machine (manufactured by Tester Sangyo Co., Ltd.).

Since the peel strength after attachment depends on the glass transition temperature (Tg) of the adhesive layer, the adhesion temperature, the material for the adherend, wettability of the adhesive layer, and the like, in order to adjust the peel strength after attachment for the temporary protective film to 5 N/m or more, optimal conditions are selected as appropriate in consideration of the glass transition temperature (Tg) of the adhesive layer, the adhesion temperature, the material of the lead frame, wettability of the adhesive layer, and the like. Among these, the influence exerted by the glass transition temperature (Tg) of the adhesive layer and the attachment (adhesion) temperature on the peel strength is significant, and usually, a high adhesion temperature that is about higher than the glass transition temperature (Tg) of the adhesive layer by about 0° C. to 30° C. is employed. However, the optimal conditions may also be determined in consideration of the material of the lead frame, wettability of the adhesive layer, or the like.

The conditions in which the temporary protective film and the lead frame are adhered in order to measure the peel strength after attachment are not particularly limited; however, the adhesion may be carried out under the conditions for attachment (adhesion) in the method for producing a lead frame, which will be described below. For example, attachment can be achieved using a copper lead frame, a copper lead frame coated with palladium, or a lead frame made of Alloy 42 as the lead frame, under any of the conditions of (1) a temperature of 230° C., a pressure of 6 MPa, and a time of 10 seconds, (2) a temperature of 350° C., a pressure of 3 MPa, and a time of 3 seconds, or (3) a temperature of 250° C., a pressure of 6 MPa, and a time of 10 seconds.

In particular, the 90-degree peel strength at 25° C. between the adhesive layer and the lead frame immediately before performing a sealing step may be 5 N/m or more, may be 10 N/m or more, and may be 50 N/m or more. In a case in which the 90-degree peel strength immediately before performing a sealing step is less than 5 N/m, there is a problem that the sealing resin penetrates between the lead frame and the adhesive layer at the time of the sealing step. Here, the phrase immediately before performing the sealing step means a time point before the sealing step, when all the processes to be carried out before the sealing step have been completed.

After the temporary protective film is attached (adhered) to the lead frame, and before the sealing step is carried out, a heating step of heating the temporary protective film-attached lead frame may be carried out. Thereby, the adhesive strength between the adhesive layer and the lead frame can be enhanced. The heating temperature in the heating step is not particularly limited; however, in order to increase the adhesive strength between the adhesive layer and the lead frame, the heating temperature may be 100° C. or higher. From the viewpoint of heat resistance of the lead frame and the temporary protective film, the heating temperature may be 400° C. or lower. For similar reasons, the heating temperature may be higher than or equal to 130° C. and lower than or equal to 350° C. The heating time is not particularly limited; however, in order to sufficiently increase the adhesive strength between the adhesive layer and the lead frame, the heating time may be 10 seconds or longer. For similar reasons, the heating time may be longer than or equal to 1 minute and shorter than or equal to 2 hours.

From the viewpoint of productivity, the above-described heating step may be carried out by heating in various processes before advancing to the sealing step (for example, a process for curing of adhesives such as a silver paste (semiconductor element adhesion step), a reflow connection process, a wire bonding process, and the like). For example, as described above, in a semiconductor element adhesion step, usually, heating is performed at 140° C. to 200° C. for 30 minutes to 2 hours in order to cure the adhesive used for adhesion. Therefore, the heating step described above can be carried out by heating in these various processes.

When the temporary protective film is attached to a lead frame such that the adhesive layer comes into contact with the lead frame, a semiconductor element is mounted on a surface of the die pad, the surface being on the opposite side of the temporary protective film, subsequently the semiconductor element, the lead frame, and the temporary protective film are heated, and then a sealing layer that seals the semiconductor element while being in contact with the adhesive layer is formed, the 90-degree peel strength (peel strength after sealing) at 180° C. between the adhesive layer and the lead frame as well as the sealing layer may be 600 N/m or less, may be 500 N/m or less, or may be 400 N/m or less. In a case in which the peel strength after sealing is more than 600 N/m, when stress is applied to the lead frame and the sealing layer, damage may occur. The peel strength after sealing may be 0 N/m or more, may be 3 N/m or more, or may be 5 N/m or more. Here, the temperature range at the time of heating the semiconductor element, the lead frame, and the temporary protective film may be 250° C. to 400° C. The time for heating (heating time) the lead frame and the temporary protective film in a temperature range of 250° C. to 400° C. may be 1 to 5 minutes.

The peel strength after sealing is measured by tearing off the temporary protective film in a direction of 90 degrees with respect to the lead frame and the sealing layer according to the 90-degree tear-off method of JIS Z 0237. Specifically, the 90-degree peel strength at the time of tearing off the temporary protective film at a speed of 270 to 330 mm per minute or 300 mm per minute at 180° C. is measured with AUTOGRAPH AGS-1000G (manufactured by Shimadzu Corp.).

Measurement of the peel strength after sealing is carried out after sealing molding. The conditions for sealing molding are not particularly limited; however, sealing conditions for the method for producing a semiconductor device as will be described below may be employed. For example, sealing may be carried out using GE-300 (manufactured by Hitachi Chemical Co., Ltd.) as a sealing material under the conditions of a temperature of 180° C., a pressure of 7 MPa, and a time of 3 minutes, and then the sealing material may be cured by heating for 5 hours at 180° C.

<Adhesive Layer>

The adhesive layer contains a resin. The resin used for the formation of the adhesive layer (hereinafter, also referred to as "resin (a)") may be a thermoplastic resin having an amide group (—NHCO—) an ester group (—CO—O—), an imide group (—NR$_2$, provided R's each represent —CO—), an ether group (—O—), or a sulfone group (—SO$_2$—). The resin (a) may be a thermoplastic resin having an amide group, an ester group, an imide group, or an ether group. Specific examples of the resin (a) include an aromatic polyamide, an aromatic polyester, an aromatic polyimide, an aromatic polyamideimide, an aromatic polyether, an aromatic polyether amideimide, an aromatic polyether amide, an aromatic polyester imide, and an aromatic polyether imide. From the viewpoints of heat resistance and adhesiveness, the resin (a) is at least one selected from the group consisting of an aromatic polyether amideimide, an aromatic polyether imide, and an aromatic polyether amide.

The resin (a) can be produced by subjecting an aromatic diamine, a bisphenol, or the like, which are basic components, and a dicarboxylic acid, a tricarboxylic acid, a tetracarboxylic acid, or an aromatic chloride, which are acidic components, or reactive derivatives thereof to polycondensation. That is, the polycondensation can be carried out by a conventional method that is used for a reaction between an amine and an acid, and there are no particular limitations on the various conditions and the like. With regard to a polycondensation reaction between an aromatic dicarboxylic acid, an aromatic tricarboxylic acid, or reactive derivatives thereof and a diamine, conventional methods are used.

As the basic component to be used for the synthesis of an aromatic polyether imide, an aromatic polyether amideimide, or an aromatic polyether amide, for example, an aromatic diamine having an ether group, such as 2,2-bis[4-(4-aminophenoxy)phenyl]propane, bis[4-(4-aminophenoxy)phenyl]sulfone, 4,4'-diaminodiphenyl ether, bis[4-(4-aminophenoy)phenyl] ether, or 2,2-bis[4-(4-aminophenoxy)]hexafluoropropane; an aromatic diamine having no ether group, such as 4,4'-methylenebis(2,6-diisopropylamine); a siloxane diamine such as 1,3-bis(3-aminopropyl)-tetramethyldisiloxane; and an α,ω-diaminoalkane such as 1,12-diaminododecane or 1,6-diaminohexane, may also be used. In the total amount of the basic component, the aromatic diamine having an ether group described above may be used in an amount of 40 mol % to 100 mol % or 50 mol % to 97 mol %, and at least one selected from an aromatic diamine having no ether group, a siloxane diamine, and an α,ω-diaminoalkane may be used in an amount of 0 mol % to 60 mol % or 3 mol % to 50 mol %. Specific examples of the basic component include: (1) a basic component composed of 60 mol % to 89 mol % or 68 mol % to 82 mol % of an aromatic diamine having an ether group, 1 mol % to 10 mol % or 3 mol % to 7 mol % of a siloxane diamine, and 10 mol % to 30 mol % or 15 mol % to 25 mol % of an α,ω-diaminoalkane; (2) a basic component composed of 90 mol % to 99 mol % or 93 mol % to 97 mol % of an aromatic diamine having an ether group, and 1 mol % to 10 mol % or 3 mol % to 7 mol % of a siloxane diamine; and (3) a basic component composed of 40 mol % to 70 mol % or 45 mol % to 60 mol % of an aromatic diamine having an ether group, and 30 mol % to 60 mol % or 40 mol % to 55 mol % of an aromatic diamine having no ether group.

Examples of the acid component to be used for the synthesis of an aromatic polyether imide, an aromatic polyether amideimide, or an aromatic polyether amide, include: (A) trimellitic anhydride, a reactive derivative of trimellitic anhydride such as trimellitic anhydride chloride, a mononuclear aromatic tricarboxylic acid anhydride such as pyromellitic dianhydride, or a mononuclear aromatic tetracarboxylic acid dianhydride; (B) a polynuclear aromatic tetracarboxylic acid dianhydride such as bisphenol A bistrimellitate dianhydride or an oxydiphthalic anhydride; (C) an aromatic dicarboxylic acid such as terephthaic acid, isophthalic acid, or a reactive derivative of phthalic acid such as terephthalic acid chloride or isophthalic acid chloride; and the like. Among them, an aromatic polyether amideimide obtainable by reacting 0.95 to 1.05 mol or 0.98 to 1.02 mol of the above-mentioned acid component (A) per 1 mol of the above-mentioned basic component (1) or (2), and an aromatic polyether imide obtainable by reacting 0.95 to 1.05 mol or 0.98 to 1.02 mol of the above-mentioned acid component (B) per 1 mol of the above-mentioned basic component (3), may also be used.

The adhesive layer may further contain a silane coupling agent. The silane coupling agent may be, for example, a compound represented by the following Formula (I):

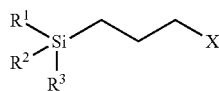
(I)

In Formula (1), $R^1$, $R^2$, and $R^3$ each independently represent an alkoxy group having 1 to 3 carbon atoms, an alkyl group having 1 to 6 carbon atoms, or an aryl group having 6 to 12 carbon atoms.

Examples of the alkoxy group having 1 to 3 carbon atoms as $R^1$, $R^2$, or $R^3$ include, for example, a methoxy group, an ethoxy group, and a propoxy group. Examples of the alkyl group having 1 to 6 carbon atoms as $R^1$, $R^2$, or $R^3$ include a methyl group, an ethyl group, a propyl group, an isopropyl group, a butyl group, an isobutyl group, a tert-butyl group, a pentyl group, and a hexyl group. Examples of the aryl group having 6 to 12 carbon atoms as $R^1$, $R^2$, or $R^3$ include a phenyl group, a tolyl group, a xylyl group, and a naphthyl group.

In Formula (I), X may be a group represented by the following Formula (IIa), (IIb), (IIc), (IId), or (IIe):

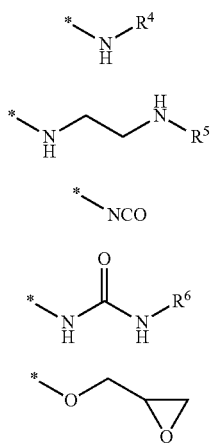

In these formulas, the symbol * represents a site of bonding to a carbon atom.

The silane coupling agent may be a compound represented by the following Formula (IIIa), in which X in Formula (I) is a group represented by Formula (IIa):

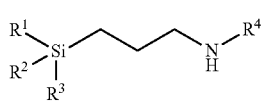
(IIIa)

In Formula (IIIa), $R^4$ represents an alkyl group having 1 to 6 carbon atoms, an aryl group having 6 to 12 carbon atoms, or a hydrogen atom. Examples of the alkyl group having 1 to 6 carbon atoms as $R^4$ include a methyl group, an ethyl group, a propyl group, an isopropyl group, a butyl group, an isobutyl group, a tert-butyl group, a pentyl group, and a hexyl group. Examples of the aryl group as $R^4$ include monovalent aryl groups each having 6 to 12 carbon atoms, such as a phenyl group, a tolyl group, a xylyl group, and a naphthyl group.

Examples of the compound represented by Formula (IIIa) include, for example, 3-aminopropyltrimethoxysilane, 3-aminopropylmethyldimethoxysilane, 3-aminopropyltriethoxysilane, 3-aminopropylmethyldiethoxysilane, 3-phenylaminopropyltrimethoxysilane, 3-phenylaminopropyltriethoxysilane, 3-phenylaminopropylmethyldimethoxysilane, 3-phenylaminopropylmethyldiethoxysilane, 3-methylaminopropyltrimethoxysilane, 3-methylaminopropyltriethoxysilane, 3-ethylaminopropyltrimethoxysilane, and 3-ethylaminopropyltriethoxysilane.

The silane coupling agent may be a compound represented by the following Formula (IIIb), in which X in Formula (I) is a group represented by Formula (IIb):

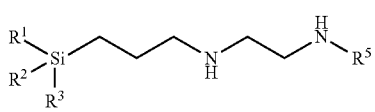
(IIIb)

In Formula (IIIb), $R^5$ represents an alkyl group having 1 to 6 carbon atoms, an aryl group having 6 to 12 carbon atoms, or a hydrogen atom. Example of the alkyl group having 1 to 6 carbon atoms and the aryl group having 6 to 12 carbon atoms as $R^5$ include groups similar to $R^4$ of Formula (IIIa).

Examples of the compound represented by Formula (IIIb) include, for example, N-(2-aminoethyl)-3-aminopropyltrimethoxysilane, N-(2-aminoethyl)-3-aminopropylmethyldimethoxysilane, N-(2-aminoethyl)-3-aminopropyltriethoxysilane, N-(2-aminoethyl)-3-aminopropylmethyldiethoxysilane, N-(2-phenylaminoethyl)-3-aminopropyltrimethoxysilane, N-(2-phenylaminoethyl)-3-aminopropyltriethoxysilane, N-(2-phenylaminoethyl)-3-aminopropylmethyldimethoxysilane, N-(2-methylaminoethyl)-3-aminopropyltimethoxysilane, N-(2-methylaminoethyl)-3-aminopropyltriethoxysilane, N-(2-ethylaminoethyl)-3-aminopropyltrimethoxysilane, and N-(2-ethylaminoethyl)-3-aminopropyltriethoxysilane.

The silane coupling agent may be a compound represented by the following Formula (IIIc), in which X in Formula (I) is a group represented by Formula (IIc):

Examples of the compound represented by Formula (IIIc) include, for example, 3-isocyanatopropyltrimethoxysilane, 3-isocyanatopropylmethyldimethoxysilane, 3-isocyanatopropyltriethoxysilane, and 3-isocyanatopropylmethydiethoxysilane.

The silane coupling agent may be a compound represented by the following Formula (IIId), in which X in Formula (I) is a group represented by Formula (IId):

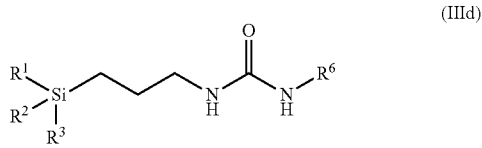

In Formula (IIId), $R^5$ represents an alkyl group having 1 to 6 carbon atoms, an aryl group having 6 to 12 carbon atom, or a hydrogen atom. Examples of the alkyl group having 1 to 6 carbon atoms and the aryl group having 6 to 12 carbon atoms as $R^6$ include groups similar to $R^4$ of Formula (IIIa).

Examples of the compound represented by Formula (IIId) include, for example, 3-ureidopropyltrimethoxysilane, 3-ureidopropylmethyldimethoxysilane, 3-ureidopropyltriethoxysilane, 3-ureidopropylmethyldiethoxysilane, 3-(3-phenylureido)propyltriethoxysilane, 3-(3-methylureido)propyltriethoxysilane, 3-(3-ethylureido)propyltriethoxysilane, 3-(3-propylureido)propyltriethoxysilane, 3-(3-butylureido) propyltriethoxysilane, 3-(3-hexylureido)propyltriethoxysilane, 3-(3-phenylureido)propyltrimethoxysilane, 3-(3-methylureido)proyltrimethoxysilane, 3-(3-ethylureido) propyltrimethoxysilane), 3-(3-propylureido) propyltrimethoxysilane), 3-(3-butylureido) propyltrimethoxysilane, and 3-(3-hexylureido) propyltrimethoxysilane.

The silane coupling agent may be a compound represented by the following Formula (IIe), in which X in Formula (I) is a group represented by Formula (IIe):

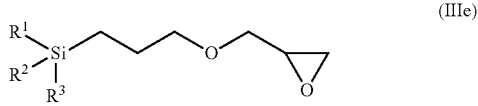

Examples of the compound represented by Formula (IIIe) include, for example, 3-glycidoxypropyltrimethoxysilane, 3-glycidoxypropylmethyldimethoxysilane, 3-glycidoxypropyltriethoxysilane, and 3-glycidoxypropylmethyldiethoxysilane.

The silane coupling agents may be used singly, or two or more kinds thereof may be used in combination.

The content of the silane coupling agent may be 1% to 40% by mass, may be 1% to 35% by mass, may be 2% to 35% by mass, may be 3% to 30% by mass, may be more than 5% by mass and less than or equal to 35% by mass, may be more than 5% by mass and less than or equal to 30% by mass or less, and may be more than 5% by mass and less than or equal to 20% by mass, with respect to the total amount of the resin (a). In a case in which the content of the silane coupling agent is 1% by mass or more, the tight adhesiveness between the adhesive layer and the lead frame as well as the sealing layer after sealing is sufficiently decreased, and it tends to become easier to peel off the temporary protective film at room temperature (25° C.). Furthermore, in a case in which the content of the silane coupling agent is 40% by mass or less, since gelation of varnish, viscosity decrease, and the like are not likely to occur, the stability of the varnish is further enhanced, and production of the temporary protective film tends to become easier.

The adhesive layer may contain a filler such as a ceramic powder, a glass powder, a silver powder, a copper powder, resin particles, or rubber particles; and a coupling agent (provided that agents corresponding to the above-mentioned silane coupling agents are excluded). In a case in which the adhesive layer contains a filler, the content of the filler may be 1 to 30 parts by mass, or may be 5 to 15 parts by mass, with respect to 100 parts by mass of the resin (a).

Examples of the coupling agent (provided that agents corresponding to the above-mentioned silane coupling agents are excluded) include a titanate, an aluminum chelate, and a zircoaluminate. The content of the coupling agent may be 1 to 15 parts by mass, or may be 2 to 10 parts by mass, with respect to 100 parts by mass of the resin (a). The content of the coupling agent may be 1 to 30 parts by mass, or may be 5 to 15 parts by mass, with respect to 100 parts by mass of the resin (a).

From the viewpoints of adhesiveness and heat resistance, the glass transition temperature of the adhesive layer may be 100° C. to 300° C., may be 130° C. to 280° C., or may be 150° C. to 250° C. In a case in which the glass transition temperature is 100° C. or higher, the adhesive strength between the lead frame as well as the sealing layer and the adhesive layer does not become too high after the sealing step. Furthermore, in a wire bonding process, since the adhesive layer is softened, the force is dispersed at the time of wire connection, and connection failure of wire is not likely to occur. On the other hand, in a case in which the glass transition temperature is 300° C. or lower, since a decrease in the adhesive strength to the lead frame is suppressed, peeling in a conveyance process, leakage of the sealing material at the time of sealing, and the like are not likely to occur.

The 5% weight reduction temperature of the adhesive layer may be 300° C. or higher, may be 350° C. or higher, or may be 400° C. or higher. In a case in which the 5% weight reduction temperature of the adhesive layer is 300° C. or higher, outgases generated by the heat produced at the time of attaching the temporary protective film to a lead frame and the heat of the wire bonding process are suppressed, and there is a tendency that the lead frame and the wire are not likely to be contaminated. Meanwhile, the 5% weight reduction temperature of the adhesive layer can be determined with a differential thermal balance (manufactured by Seiko Instruments, Inc., TG/DTA220) at a rate of temperature increase of 10° C./min.

The elastic modulus at 200° C. of the adhesive layer may be 1 MPa or higher, or may be 3 MPa or higher. The wire bonding temperature is not particularly limited; however, generally, the wire bonding temperature is about 200° C. to 230° C., and a temperature plus or minus 200° C. is widely used. Therefore, in a case in which the elastic modulus at 200° C. is 1 MPa or higher, softening of the adhesive layer caused by heat in the wire bonding process is suppressed, and there is a tendency that joining failure of wire is not likely to occur. The upper limit of the elastic modulus at 200° C. of the adhesive layer may be 2,000 MPa, may be 1,500 MPa, or may be 1,000 MPa. The elastic modulus at 200° C. of the adhesive layer can be measured with a dynamic viscoelasticity measuring apparatus (manufactured by UBM Co., Ltd., Rheogel-E4000) by setting the distance between chucks to 20 mm, in a tensile mode with sinusoidal waves, a rate of temperature increase of 5° C./min, and a frequency of 10 Hz.

The thickness (A) of the adhesive layer may be 20 µm or less, 18 µm or less, 16 µm or less, 14 µm or less, 12 µm or less, 10 µm or less, 9 µm or less, or 8 µm or less, from the viewpoint that curling of the temporary protective film is more easily suppressed. Furthermore, the thickness (A) of the adhesive layer may be 1 µm or more, 2 µm or more, 3 µm or more, 4 µm or more, 5 µm or more, 6 µm or more, 7 µm or more, or 8 µm or more. The thickness (A) of the adhesive layer may be 1 to 20 or less, may be 1 to 15 or less, or may be 1 to 8 µm or less. In a case in which the thickness of the adhesive layer is 1 µm or more, sufficient adhesiveness can be secured, and there is a tendency that the sealing material is not likely to leak at the time of sealing. In a case in which the thickness (A) of the adhesive layer is 20 µm or less, the layer thickness of the temporary protective film is decreased, and the economic efficiency tends to be excellent. In addition to that, generation of voids at the time of performing a heat treatment at 300° C. or higher is further suppressed. Furthermore, in a case in which the thickness (A) of the adhesive layer is 20 µm or less, an increase of wettability at the time of heat treatment is suppressed, and strong attachment between the adherend and the adhesive layer is suppressed. Therefore, peelability becomes superior.

In a case in which an adhesive layer is provided on both surfaces of the support film, the ratio of thicknesses of the two adhesive layers (thickness of the adhesive layer provided on the side that is adhered to the lead frame: thickness of the adhesive layer provided on the opposite side) may be 0.8:1 to 1.2:1, may be 0.9:1 to 1.1:1, or may be 1:1.

<Support Film>

The support film is not particularly limited, however, the support film may be a film formed from a resin that can endure heat during application and drying of a resin that is used for forming an adhesive layer or a non-adhesive layer, and during a semiconductor device assembly process (heat-resistant resin). The support film may be, for example, a film of at least one polymer selected from the group consisting of an aromatic polyimide, an aromatic polyamide, an aromatic polyamideimide, an aromatic polysulfone, an aromatic polyethersulfone, a polyphenylene sulfide, an aromatic polyether ketone, a polyallylate, an aromatic polyether ether ketone, and polyethylene naphthalate.

The glass transition temperature of the support film may be 200° C. or higher, or may be 250° C. or higher, in order to increase heat-resistance. By using a film of the above-described polymers, in processes of applying heat, such as a process of adhering a semiconductor element to a die pad, a wire bonding process, a sealing process, and a process of tearing off the temporary protective film from a sealing molded body, the support film is not softened, and the operation can be carried out efficiently.

In order to reduce warpage of the lead frame after the temporary protective film is attached to the lead frame, the coefficient of linear expansion of the support film at 20° C. to 200° C. may be $3.0\times10^{-5}$/° C. or less, may be $2.5\times10^{-5}$/° C. or less, or may be $2.0\times10^{-5}$/° C. or less. The coefficient of linear expansion of the support film at 20° C. to 200° C. is carried out according to JIS K 7197. Measurement uses a thermomechanical analyzer (TMA). The distance between chucks is set to 10 mm, and the coefficient of thermal expansion at 20° C. to 200° C. is calculated.

In order to reduce warpage of the lead frame after the temporary protective film is attached to the lead frame, the shrinkage factor (heat shrinkage factor) of the support film when heated for 60 minutes at 200° C. may be 0.15% or less, may be 0.13% or less, or may be 0.10% or less. Measurement of the heat shrinkage factor can be carried out according to JIS K 7133. For the measurement of the heat shrinkage factor, a CNC image analysis system (NEXIV) is used. The heat shrinkage factor can be determined by measuring the difference of the dimensions in the MD direction (longitudinal direction) or the TD direction (direction perpendicular to the MD direction) of the support film before and after a heat treatment. The heat treatment conditions are a temperature of 200° C. and a time of 60 minutes. The heat shrinkage factor is a measured value in a direction between the MD direction and the TD direction, whichever gives a bigger value.

It is preferable that the support film has sufficiently high adhesiveness to the adhesive layer. When the adhesiveness is low, at the time of tearing off the support film from the lead frame and the sealing material at a temperature of 100° C. to 300° C. detachment is likely to occur at the interface between the adhesive layer 2 and the support film, and the resin is likely to remain on the lead frame and the sealing material. Since it is preferable that the support film has heat resistance and sufficiently high adhesiveness to the adhesive layer, the support film may be a polyimide film.

Regarding the support film, the surface may be treated in order to sufficiently increase tight adhesiveness to the adhesive layer. The method for surface-treating the support film is not particularly limited; however, examples include chemical treatments such as an alkali treatment and a silane coupling treatment; physical treatments such as a sand mat treatment; a plasma treatment, a corona treatment, and the like.

The thickness of the support film is not particularly limited; however, the thickness may be 5 to 100 µm, or may be 5 to 50 µm or less. In a case in which the thickness of the support film is less than 5 µm, creases are likely to be produced in the temporary protective film, and workability tends to deteriorate. In a case in which the thickness is more than 100 µm, warpage of the lead frame after the temporary protective film has been attached to the lead frame tends to increase.

The material of the support film can also be selected from the group consisting of copper, aluminum, stainless steel, and nickel, in addition to the polymers described above. By making the support film from a metal, the coefficients of linear expansion of the lead frame and the support film can be made closer, and warpage of the lead frame after the temporary protective film has been attached to the lead frame can be reduced.

The ratio $T_2/T_1$ of the thickness $T_2$ of the adhesive layer with respect to the thickness $T_1$ of the support film may be 0.5 or less, may be 0.3 or less, or may be 0.2 or less. The thickness $T_2$ of the adhesive layer as used herein is the thickness of only one surface of the adhesive layer formed on the support film. In a case in which the adhesive layer is provided on both surfaces of the support film, the thickness $T_2$ of the adhesive layer is the thickness of a thicker one of the adhesive layers.

In a case in which $T_2/T_1$ is more than 0.5, the film is likely to undergo curling due to volume reduction of the adhesive layer at the time of removal of the solvent after coating, and workability at the time of attaching to the lead frame tends to deteriorate.

<Non-Adhesive Layer>

A non-adhesive layer is a resin layer that substantially does not have adhesiveness (or pressure-sensitive adhesiveness) to a lead frame at 0° C. to 270° C. The non-adhesive layer may be a resin that is not easily softened at high temperature, and for example, a resin layer having a high glass transition temperature can function as a non-adhesive layer.

The non-adhesive layer contains a resin. The composition of the resin that is used for the formation of the non-adhesive layer (hereinafter, also referred to as "resin (b)") is not particularly limited; however, thermoplastic resins and thermosetting resins can all be used. The composition of the thermoplastic resin is not particularly limited; however, the thermoplastic resin may be a thermoplastic resin having an amide group, an ester group, an imide group, an ether group, or a sulfone group. Furthermore, the composition of ththermosetting resin is not particularly limited; however, examples include an epoxy resin, a phenolic resin, a bismaleimide resin (for example, a bismaleimide resin formed from bis(4-maleimidophenyl)methane as a monomer), and the like. Furthermore, a thermoplastic resin and a thermosetting resin can also be used in combination. In a case in which a thermoplastic resin and a thermosetting resin are used in combination, the thermosetting resin may be used in an amount of 5 to 100 parts by mass, or may be used in an amount of 20 to 70 parts by mass, with respect to 100 parts by mass of the thermoplastic resin.

The non-adhesive layer may also contain a filler such as a ceramic powder, a glass powder, a silver powder, a copper powder, resin particles, or rubber particles; a coupling agent; and the like. In a case in which the non-adhesive layer contains a filler, the content of the filer may be 1 to 30 parts by mass, or may be 5 to 15 parts by mass, with respect to 100 parts by mass of the resin (b). The content of the coupling agent may be 1 to 20 parts by mass, or may be 2 to 15 parts by mass, with respect to 100 parts by mass of the resin (b).

The elastic modulus at 200° C. of the non-adhesive layer may be 10 MPa or higher, may be 100 MPa or higher, or may be 1,000 MPa or higher. In a case in which the elastic modulus at 200° C. of the non-adhesive layer is 10 MPa or higher, the non-adhesive layer is not easily softened in a process where heat is applied, such as a wire bonding process, and there is a tendency that the non-adhesive layer is not easily attached to a mold and jigs. The elastic modulus at 200° C. of the non-adhesive layer may be 2,000 MPa or less, or may be 1,800 MPa or less.

The elastic modulus at 200° C. of the non-adhesive layer can be measured with a dynamic viscoelasticity measuring apparatus (manufactured by UBM Co., Ltd., Rheogel-E4000) by setting the distance between chucks to 20 mm, in a tensile mode with sinusoidal waves, a rate of temperature increase of 5° C./min, and a frequency of 10 Hz.

The adhesive force of the non-adhesive layer to a mold and jigs is not particularly limited as long as the adhesive force is low to the extent that the non-adhesive layer does not adhere to the mold and/or jigs during a process; however, the peel strength at a peeling angle of 90 degrees between the non-adhesive layer and the mold as well as jigs at normal temperature (for example, 25° C.) may be less than 5 N/m, or may be 1 N/m or less. This peel strength is measured, for example, after the non-adhesive layer is pressure-bonded to a mold made of brass at a temperature of 250° C. and a pressure of 8 MPa for 10 seconds.

The glass transition temperature of the non-adhesive layer may be 150° C. or higher may be 200° C. or higher, or may be 250° C. or higher, in order to make the no-adhesive layer difficult to be softened in a process of adhering a semiconductor element to a die pad, a wire bonding process, a sealing process, a process of tearing off the temporary protective film from a sealing molded body, and the like, and to make it difficult for the non-adhesive layer to be attached to a mold and jigs. The glass transition temperature of the non-adhesive layer may be 350° C. or lower, or may be 300° C. or lower.

<Method for Producing Temporary Protective Film>

A temporary protective film according to an embodiment can be produced by, for example, the following method. First, resin (a) is mixed with a solvent such as N-methyl-2-pyrrolidone, dimethylacetamide, diethylene glycol dimethyl ether, tetrahydrofuran, cyclohexanone, methyl ethyl ketone, or dimethylformamide, and other components such as a silane coupling agent as necessary, and a varnish for adhesive layer formation including the resin (a) or a precursor thereof is produced. The varnish for adhesive layer formation thus produced is applied on one surface or both surfaces of a support film, the solvent is removed from the coating film by a heating treatment, and thereby an adhesive layer is formed on one surface or both surfaces of the support film. Thereby, a temporary protective film having a two-layer structure or a three-layer structure can be obtained. Furthermore, instead of the resin (a), a precursor of the resin (a) (for example, a polyimide resin) that becomes the resin (a) (for example, a polyimide resin) as the solvent is removed by a heating treatment or the like after the varnish application, may also be used. From the viewpoint of the surface state or the like of the coated surface, a varnish including the resin (a) may also be used.

A temporary protective fin having a two-layer structure, in which an adhesive layer is provided on one surface of a support film, may be converted to a temporary protective film having a three-layer structure by providing a non-adhesive layer on the other surface. A temporary protective film having a three-layer structure including an adhesive layer, a support film, and a non-adhesive layer can be produced by, for example, the following method. First, resin (b) is mixed with a solvent such as N-methyl-2-pyrrolidone, dimethylacetamide, diethylene glycol dimethyl ether, tetrahydrofuran, cyclohexanone, methyl ethyl ketone, or dimethylformamide and other components such as a silane coupling agent as necessary, and a varnish for non-adhesive layer formation including the resin (b) or a precursor thereof is produced. The varnish for non-adhesive layer formation thus produced is applied on a surface of the support film of the temporary protective film having a two-layer structure, the surface being on the opposite side of the surface where the adhesive layer is provided, subsequently the solvent is removed from the coating film by a heating treatment, and thereby a non-adhesive layer is formed on the surface of the support film on the opposite side of the surface where the adhesive layer is provided. Thereby, a temporary protective film having a three-layer structure including an adhesive layer, a support film, and a non-adhesive layer can be obtained. Furthermore, instead of the resin (b), a precursor of the resin (b) (for example, a polyimide resin) that becomes the resin (b) (for example, a polyimide resin) as the solvent is removed by a heating treatment or the like after the varnish application, may also be used. From the viewpoint of the surface state or the like of the coated surface, a varnish including the resin (b) may also be used.

The method for applying a varnish on one surface of the support film is not particularly limited; however, for example, roll coating, reverse roll coating, gravure coating, bar coating, comma coating, die coating, or reduced pressure die coating can be used. In a case in which the varnish is applied on both surfaces of the support film, the varnish may be applied by passing the support film through a varnish including a resin or a precursor thereof.

After the application of the varnish, in a case in which the support film is subjected to a heating treatment for the removal of solvent, imidization, or the like, the treatment temperature in this case may be different from the case of using a varnish including a resin (resin (a) or resin (b)) to the case of using a varnish including a precursor of a resin. The treatment temperature in the case of using a varnish including a resin may be any temperature at which the solvent can be removed, and in the case of using a varnish including a precursor of a resin, the treatment temperature may be higher than or equal to the glass transition temperature of the adhesive layer or the non-adhesive layer in order to convert the precursor of a resin into a resin (for example, imidizing the precursor).

The thickness of the non-adhesive layer may be, for example, 10 μm or less, 9 μm or less, 8 μm or less, or 7 μm or less. The thickness of the non-adhesive layer may be, for example, 1 μm or more, 2 μm or more, 3 μm or more, 4 μm or more, 5 μm or more, or 6 μm or more. The thickness of the non-adhesive layer is not particularly limited; however, the thickness may be, for example, 1 to 10 μm, or 1 to 8 μm.

<Method for Producing Semiconductor Device>

A semiconductor device can be produced by a method including a sealing molding process of a semiconductor element using the temporary protective film according to an embodiment. The semiconductor device thus produced may be, for example, a Non Lead Type Package, which has a lead frame and a semiconductor element mounted thereon; and a sealing layer sealing the semiconductor element on the semiconductor element-side of the lead frame, with the rear surface of the lead frame being exposed for external connection. Specific examples thereof include QuadFlat Non-leaded Package (QFN) and Small Outline Non-leaded Package (SON).

Figure 3:
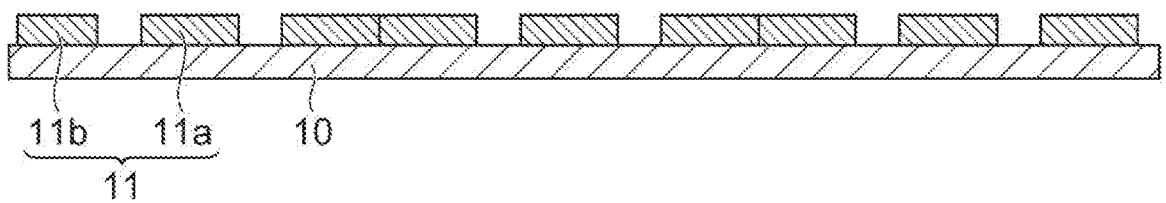
FIG. 3 is a cross-sectional view explaining an embodiment of a method for producing a semiconductor device.
Figure 4:
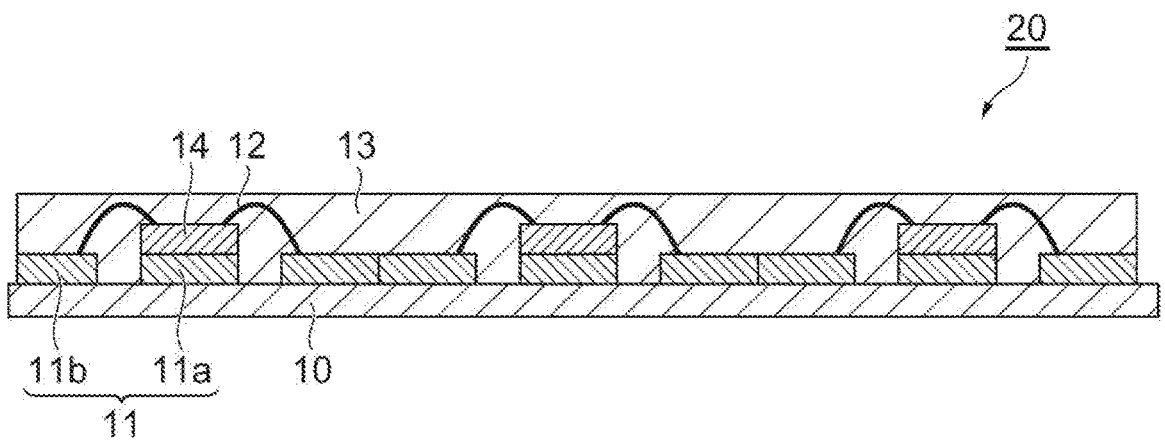
FIG. 4 is a cross-sectional view explaining an embodiment of a method for producing a semiconductor device.
Figure 5:
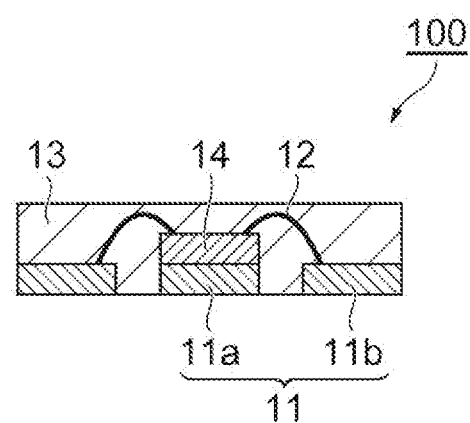
FIG. 5 is a cross-sectional view illustrating an embodiment of a semiconductor device.

FIGS. 3 and 4 are cross-sectional views illustrating a method for producing a semiconductor device according to an embodiment. FIG. 5 is a cross-sectional view illustrating an embodiment of a semiconductor device obtainable according to the production method of FIGS. 3 and 4. Hereinafter, various processes will be explained with reference to the various drawings as necessary.

The method for producing a semiconductor device according to the embodiment of FIG. 3 includes a step of attaching a temporary protective film 10 on one surface (rear surface) of a lead frame 11 having a die pad 11a and an inner lead 11b, in a direction in which an adhesive layer of the temporary protective film faces the lead frame; a step of mounting (adhering) a semiconductor element 14 on a surface of the die pad 11a, the surface being on the opposite side of the temporary protective film 10; a step of providing a wire 12 for connecting the semiconductor element 14 and the inner lead 11b; a step of forming a sealing layer 13 sealing the semiconductor element 14 and the wire 12, and thereby obtaining a sealing molded body 20 having a lead frame 11, a semiconductor element 14, and a sealing layer 13; and a step of peeling off the temporary protective film 10 from the sealing molded body 20, in this order.

Attachment of the temporary protective film 10 to the lead frame 11 can be carried out at normal temperature (for example, 5° C. to 35° C.). The attaching method is not particularly limited; however, for example, a roll lamination method may be used.

The conditions for adhesion of the temporary protective film 10 to the lead frame 11 are not particularly limited; however, the adhesion temperature may be 150° C. to 400° C., may be 180° C. to 350° C., or may be 200° C. to 300° C. In a case in which the adhesion temperature is 150° C. or higher, the adhesive strength between the lead frame 11 and the adhesive layer 2 tends to be increase further. Furthermore, in a case in which the adhesion temperature is 400° C. or lower, deterioration of the lead frame 11 tends to be further suppressed.

The pressure for adhesion of the temporary protective film 10 to the lead frame 11 may be 0.5 to 30 MPa, may be 1 to 20 MPa, or may be 3 to 15 MPa. In a case in which the adhesion pressure is 0.5 MPa or higher, the adhesive strength between the adhesive layer 2 and the lead frame 11 tends to increase further. Furthermore, in a case in which the adhesion pressure is 30 MPa or lower, damage of the lead frame 11 tends to be more easily suppressed.

The time for adhesion of the temporary protective film 10 to the lead frame 11 may be between 0.1 and 60 seconds, may be 1 to 30 seconds, or may be 3 to 20 seconds. In a case in which the adhesion time is 0.1 seconds or longer, the adhesive strength between the adhesive layer 2 and the lead frame 11 tends to increase further. Furthermore, in a case in which the adhesion time is 60 seconds or less, workability and productivity tend to be more easily enhanced. Furthermore, before a pressure is applied, preliminary heating may be carried out for about 5 to 60 seconds.

The material for the lead frame 11 is not particularly limited; however, for example, the material may be an iron-based alloy such as Alloy 42, copper, or a copper-based alloy. Furthermore, in the case of using copper and a copper-based alloy, the surface of the lead frame may be subjected to a coating treatment with palladium, gold, silver, or the like.

The semiconductor element 14 is usually mounted (adhered) on the die pad 11a by means of an adhesive (for example, a silver paste). The adhesive may be cured by means of a heating treatment (for example, 140° C. to 200° C., 30 minutes to 2 hours).

After the semiconductor element is mounted (adhered), reflow connection (Cu Clip connection or the like) may be carried out under the conditions of a maximum temperature in the temperature range of 250° C. to 400° C. for 1 to 30 minutes.

The wire 12 is not particularly limited, however, for example, the wire may be a gold wire, a copper wire, or a palladium-coated copper wire. For example, the semiconductor element and the inner lead may be joined with a wire 12 by heating for 3 to 60 minutes at 200° C. to 270° C. and utilizing ultrasonic waves and pressing pressure.

In the process for sealing molding, the sealing layer 13 is formed using a sealing material. Through sealing molding, a sealing molded body 20 having a plurality of semiconductor elements 14 and a sealing layer 13 integrally sealing those, is obtained. During the sealing molding, since the temporary protective film 10 is provided, the sealing material is prevented from wrapping around the rear surface side of the lead frame 11.

A temporary protective film-attached sealing molded body according to an embodiment includes a lead frame 11 having a die pad 11a and an inner lead 11b; a semiconductor element 14 mounted on the die pad 11a; a wire 12 connecting the semiconductor element 14 and the inner lead 11b; a sealing layer 13 sealing the semiconductor element 14 and the wire 12; and a temporary protective film 10, and in the temporary protective film 10, the adhesive layer 2 thereof is attached to a surface of the lead frame 11, the surface being on the opposite side of the surface where the semiconductor element 14 is mounted.

The temperature during the formation of the sealing layer 13 (sealing temperature) may be 140° C. to 200° C., or may be 160° C. to 180° C. The pressure during the formation of the sealing layer (sealing pressure) may be 6 to 15 MPa, or may be 7 to 10 MPa. The heating time for sealing molding (sealing time) may be 1 to 5 minutes, or may be 2 to 3 minutes.

The sealing layer 13 thus formed may be heated and cured as necessary. The heating temperature for curing of the sealing layer 13 (sealing curing temperature) may be 150° C. to 200° C., or may be 160° C. to 180° C. The heating time for curing of the sealing layer 13 (sealing curing time) may be 4 to 7 hours, or may be 5 to 6 hours.

The material for the sealing material is not particularly limited; however, examples include epoxy resins such as a cresol novolac epoxy resin, a phenol novolac epoxy resin, a biphenyl diepoxy resin, and a naphthol novolac epoxy resin. In the sealing material, for example, additive materials such as a filler, a flame retardant substance such as a bromine compound, and a wax component may be incorporated.

After the formation of the sealing layer 13 (sealing molding), the temporary protective film 10 is peeled off from the lead frame 11 and the sealing layer 13 of the sealing molded body 20. In the case of curing the sealing layer, the temporary protective film 10 may be peeled off at any time point before or after curing of the sealing layer 13.

The temperature at which the temporary protective film 10 is peeled off from the sealing molded body (peeling temperature) may be between 0° C. and 250° C. In a case in which the peeling temperature is 0° C. or higher, it is more difficult for the adhesive layer to remain on the lead frame 11 and the sealing layer 13. Furthermore, in a case in which the peeling temperature is 250° C. or lower, deterioration of the lead frame 11 and the sealing layer 13 tends to be more easily suppressed. For similar reasons, the peeling temperature may be 100° C. to 200° C., or may be 150° C. to 250° C.

The method for producing a semiconductor device may further include, if necessary, a step of removing the adhesive layer (adhesive residue) remaining on the lead frame 11 and the sealing layer 13 after the peeling step. It is preferable that when the temporary protective film 10 is torn off at 180° C. after sealing with the sealing material has been achieved, the adhesive layer 2 does not remain on the lead frame 11 and the sealing layer 13. In a case in which the residual amount of the adhesive layer is large, not only the external appearance may be poor, but also when the lead frame 11 is used for external connection, the residue is likely to cause connection failure. Therefore, the adhesive layer remaining on the lead frame 11 and the sealing layer 13 may be removed by mechanical brushing, a solvent, or the like. The solvent is not particularly limited; however, N-methyl-2-pyrrolidone, dimethylacetamide, diethylene glycol dimethyl ether, tetrahydrofuran, cyclohexanone, methyl ethyl ketone, dimethylformamide, and the like are desirable.

In a case in which the lead frame includes a plurality of patterns each having a die pad and an inner lead, if necessary, a plurality of the semiconductor device 100 of FIG. 5 each having one semiconductor element can be obtained by dividing the sealing molded body 20.

That is, in a case in which the lead frame 11 has a plurality of die pads 11a, and a semiconductor element 14 is mounted on each of the multiple die pads 11a, the production method according to the embodiment may further include a step of dividing the sealing molded body 20 before or after the temporary protective film 10 (or 10') from the sealing molded body 20, and thereby obtaining semiconductor devices 100 each having one die pad 11a and semiconductor element 14.

A semiconductor device may be produced while a temporary protective film is unwound from the reel body obtained by winding a long temporary protective film around a winding core. The reel body in this case has a winding core and a temporary protective film wound around the winding core according to the above-described embodiment.

Figure 7:
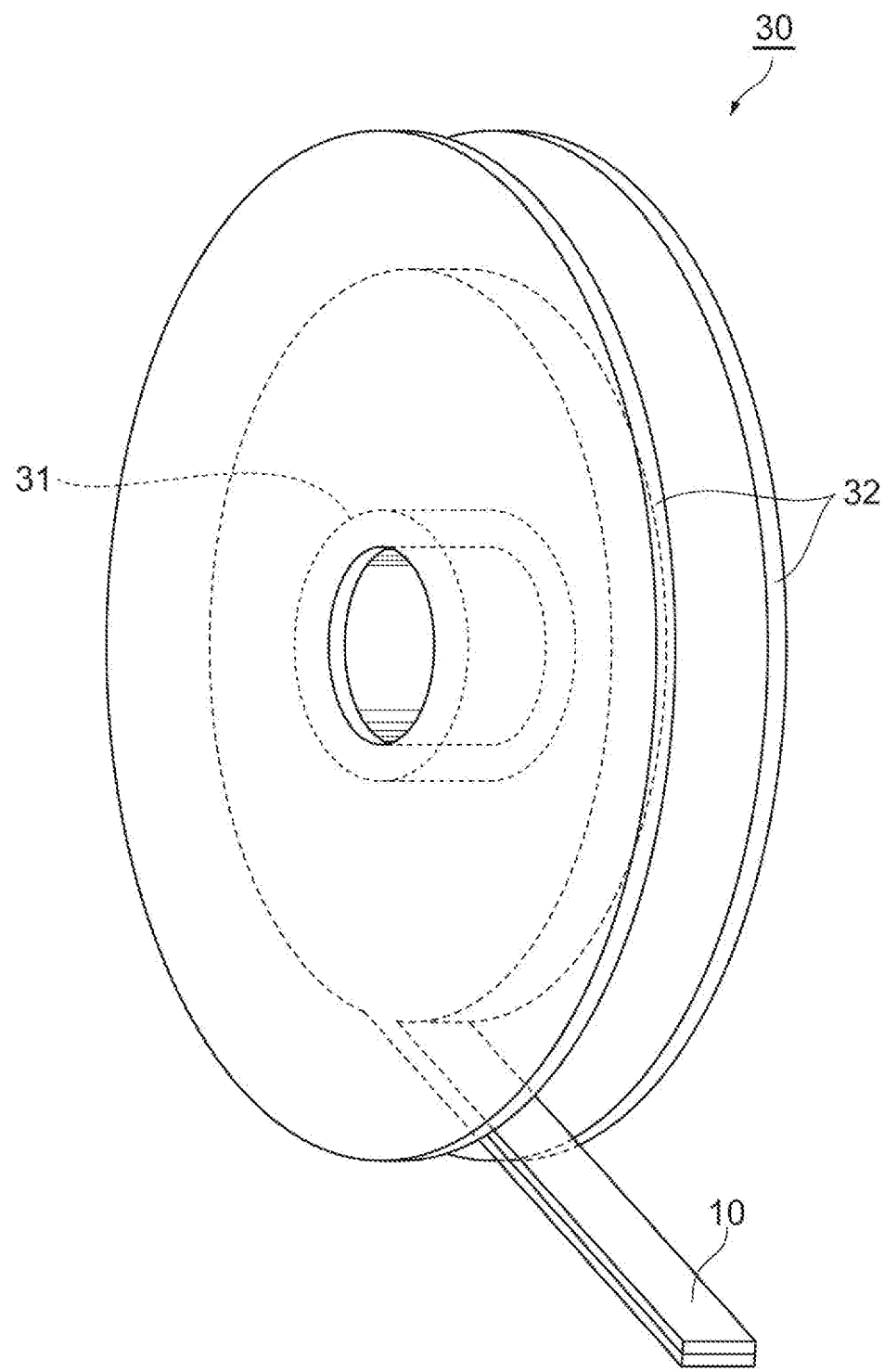
FIG. 7 is a perspective view illustrating an embodiment of a reel body.

FIG. 7 is a perspective view illustrating an embodiment of a reel body. The reel body 30 illustrated in FIG. 7 includes a winding core 31, a temporary protective film 10 wound around the winding core 31, and side plates 32.

The width (length in a direction orthogonally intersecting the direction of winding) of the winding core 31 and the temporary protective film 10 may be, for example, 10 μm or more, 50 μm or more, 50 μm or more, or 80 μm or more, and may be 300 μm or less. The width (length in a direction orthogonally intersecting the direction of winding) of the winding core 31 and the temporary protective film 10 may be, for example, more than or equal to 10 μm and less than or equal to 300 μm, more than or equal to 50 μm and less than or equal to 300 μm, or more than or equal to 80 μm and less than or equal to 300 μm.

Figure 8:
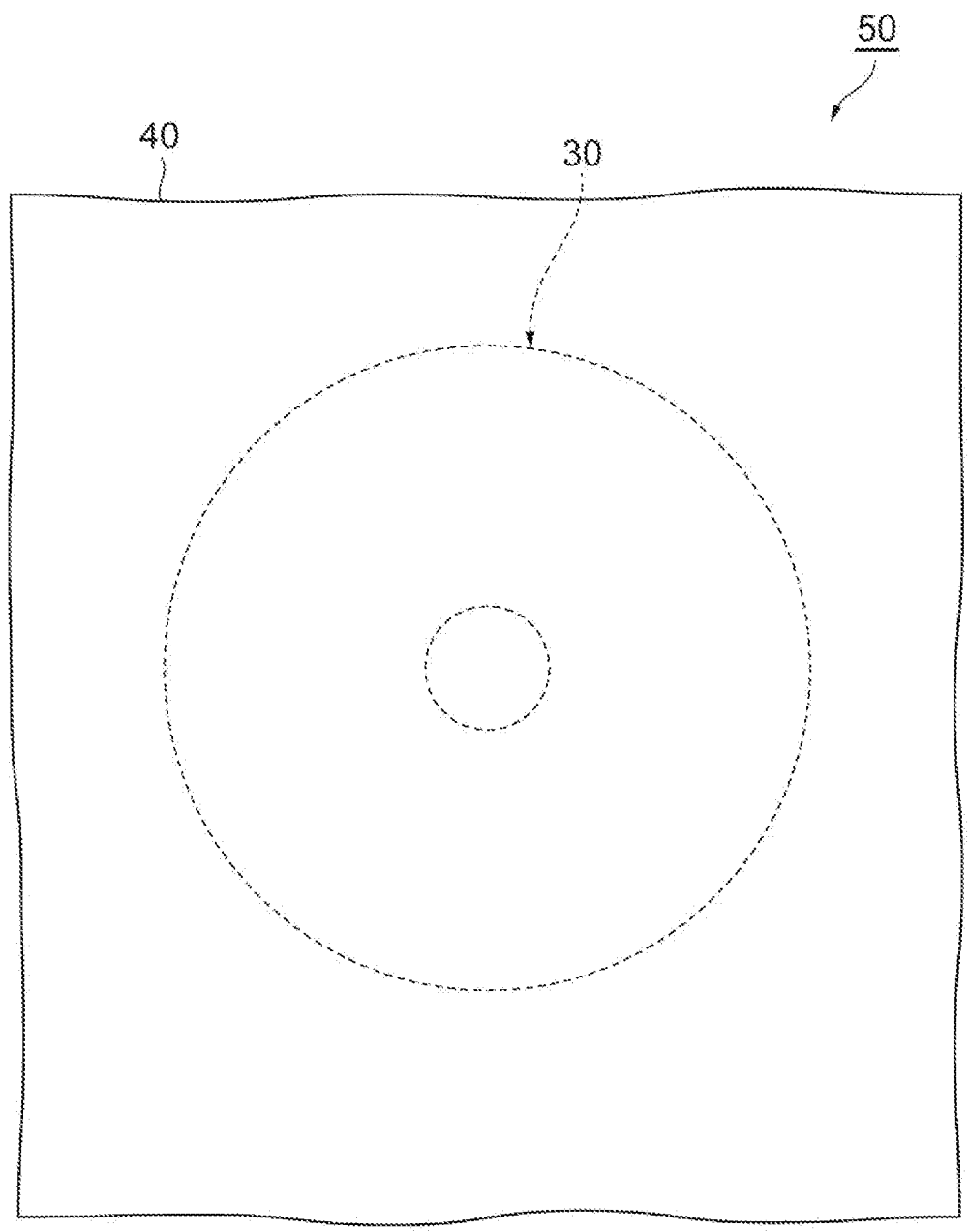
FIG. 8 is a front view diagram illustrating an embodiment of a package.

The temporary protective film according to the above-described embodiments may be supplied as a package in which the above-described reel body is accommodated in a packaging bag. FIG. 8 illustrates an embodiment of the package. As illustrated in FIG. 8, the package 50 includes the reel body 30 and a packaging bag 40 accommodating the reel body 30. The reel body 30 is usually individually accommodated in a packaging bag; however, a plurality of (for example, two or three) the reel bodies 30 may be accommodated in one packaging bag 40.

The packaging bag 40 may be formed from a resin film, or may be formed from a composite film, which is a resin film having an aluminum layer. A specific example of the packaging bag 40 may be an aluminum-coated plastic bag, or the like. Examples of the material of the resin film include plastics such as polyethylene, polyester, vinyl chloride, and polyethylene terephthalate. The reel body 30 may be, for example, accommodated in a packaging bag in a vacuum-packed state. The package 50 is not limited to a vacuum-packed product.

In the packaging bag 40, a desiccant may be accommodated together with the reel body 30. Examples of the desiccant include silica gel. The package 50 may be a product in which the packaging bag 40 accommodating the reel body 30 is further wrapped with a cushioning material.

Figure 9:
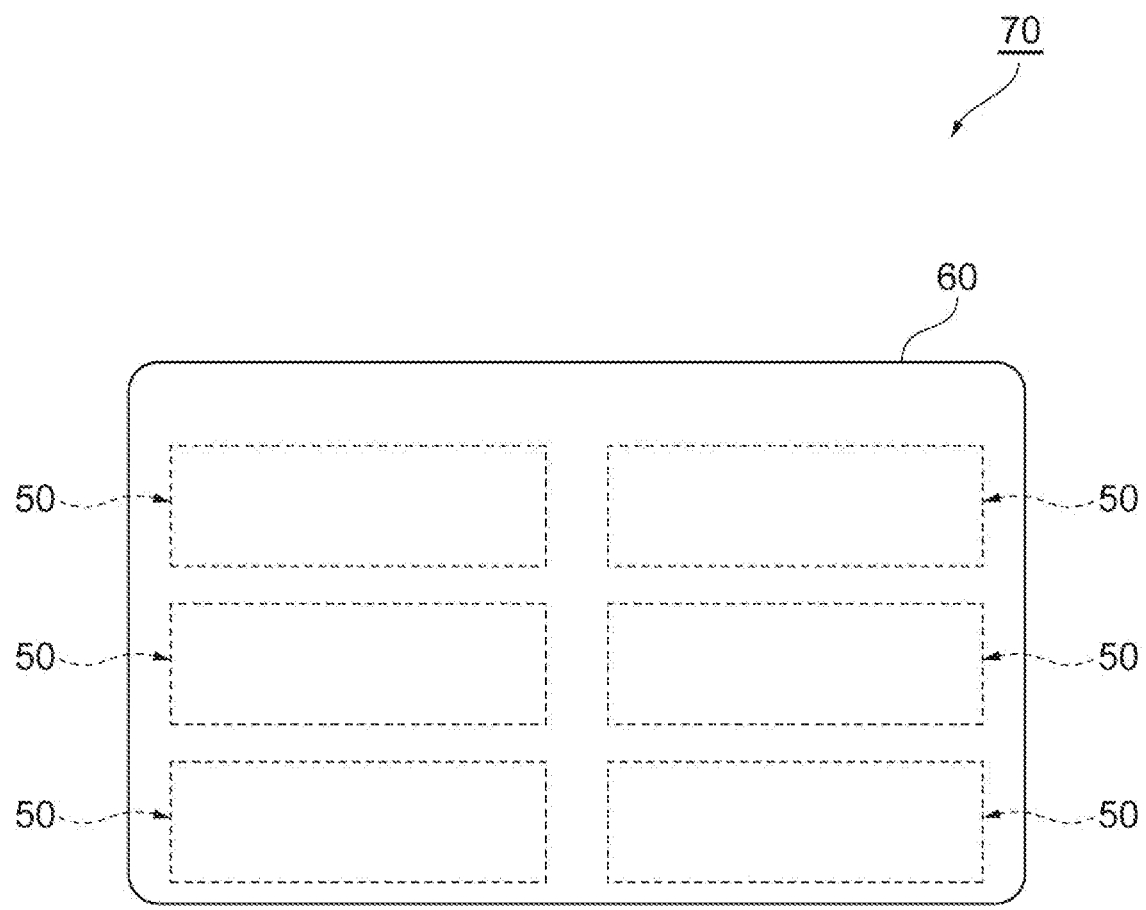
FIG. 9 is a front view diagram illustrating an embodiment of a packing material.

The package 50 may be supplied as a packing material accommodated in a packing box. FIG. 8 illustrates an embodiment of the packing material. As illustrated in FIG. 9, the packing material 70 includes the package 50 and a packing box 60 accommodating the package 50. In the packing box 60, one or a plurality of packages 50 are accommodated. As the packing box 60, for example, corrugated cardboard can be used.

The semiconductor device produced using the temporary protective film according to an embodiment is excellent in view of density increase, area reduction, thickness reduction, and the like, and can be suitably utilized in electronic instruments such as, for example, mobile telephones, smart phones, personal computers, and tablets.

EXAMPLES

Hereinafter, the present invention will be described more specifically by way of Examples; however, the present invention is not intended to be limited to the following Examples.

Production of Varnish for Adhesive Layer Formation

Production Example 1

(Synthesis of Resin)

In a 5,000-ml four-necked flask equipped with a thermometer, a stirrer, a nitrogen inlet tube, and a fractionating column, 270.9 g (0.66 mol) of 2,2-bis[-(4-aminophenoxy)phenyl]propane and 8.7 g (0.035 mol) of 1,3-bis(3-aminopropyl)-tetramethyldisiloxane were introduced in a nitrogen atmosphere, and this was dissolved in 1,950 g of N-methyl-2-pyrrolidone (NMP). Furthermore, this solution was cooled to 0° C., and 149.5 g (0.71 mol) of trimellitic anhydride chloride was added thereto at this temperature. After trimellitic anhydride chloride dissolved, 100 g of triethylamine was added thereto. Stirring was continued for 2 hours at room temperature, subsequently the temperature was increased to 180° C., and imidization was completed by a reaction for 5 hours. The reaction liquid was introduced into methanol, and a polymer was isolated. This was dried and then was dissolved in N-methyl-2-pyrrolidone. The solution was introduced into methanol, and the polymer was isolated again. The polymer thus isolated was dried under reduced pressure, and thereby purified polyether amideimide in a powder form was obtained. This was designated as polyether amideimide A.

(Production of Varnish for Adhesive Layer Formation)

22 g of polyether amideimide A and 2.2 g of N-(2-aminoethyl)-3-aminopropyltrimethoxysilane (manufactured by Shin-Etsu Chemical Co., Ltd., trade name: KBM603) were dissolved in 78 g of NMP and varnish for adhesive layer formation 1A was produced.

22 g of polyether amideimide A and 4.4 g of 3-isocyanatopropyltriethoxysilane (manufactured by Shin-Etsu Co., Ltd., trade name: KBE9007) were dissolved in 78 g of NMP, and varnish for adhesive layer formation 1B was produced.

22 g of polyether amideimide A was dissolved in 78 g of NMP, and varnish for adhesive layer formation 1C was produced.

22 g of polyether amideimide A and 6.6 g of 3-glycidoxypropyltrimethoxysilane (manufactured by Dow Corning Toray Silicone Co., Ltd., trade name: SH6040) were dissolved in 78 g of NMP, and varnish for adhesive layer formation 1D was produced.

Production Example 2

(Synthesis of Resin)

In a 1,000-ml four-necked flask equipped with a stirrer, a thermometer, a nitrogen gas inlet tube, and a cooling tube, 120.9 g (0.41 mol) of 1,3-bis(3-aminophenoxy)benzene and 44.0 g (0.18 mol) of 1,3-bis(3-aminopropyl)tetramethyldisiloxane, and this were added to 538.3 g of NMP in a nitrogen atmosphere, and the mixture was dissolved uniformly. Furthermore, this solution was cooled to 0° C., and at this temperature, 125.0 g (0.59 mol) of trimellitic anhydride chloride was added thereto, and the mixture was stirred for one hour at room temperature (25° C.). 72.6 g of triethylamine was added to the reaction solution, the mixture was stirred for one hour at room temperature (25° C.), and then the mixture was stirred for 6 hours at 180° C. A reaction liquid thus obtained was introduced into water, and a polymer was isolated. This was dried and then was dissolved in NMP, the solution was introduced into water, and the polymer was isolated again. The polymer thus isolated was dried under reduced pressure, and thereby purified polyether amideimide in a powder form was obtained. This was designated as polyether amideimide B.

(Production of Varnish for Adhesive Layer Formation)

22 g of polyether amideimide B and 2.2 g of 3-aminopropyltrimethoxysilane (manufactured by Shin-Etsu Chemical Co., Ltd., trade name: KBM903) were dissolved in 78 g of NMP, and varnish for adhesive layer formation 2A was produced.

22 g of polyether amideimide B and 2.2 g of N-(2-aminoethyl)-3-aminopropylmethyldimethoxysilane (manufactured by Shin-Etsu Chemical Co., Ltd., trade name: KBM602) were dissolved in 78 g of NMP, and varnish for adhesive layer formation 2B was produced.

22 g of polyether amideimide B was dissolved in 78 g of NMP, and varnish for adhesive layer formation 2C was produced.

22 g of polyether amideimide B and 0.66 g of 3-glycidoxypropyltrimethoxysilane (manufactured by Dow Corning Toray Silicone Co., Ltd., trade name: SH6040) were dissolved in 78 g of NMP, and varnish for adhesive layer formation 2D was produced.

Production Example 3

(Synthesis of Resin)

In a 5,000-ml four-necked flask equipped with a stirrer, a thermometer, a nitrogen gas inlet tube, and a cooling tube, 253.3 g (0.81 mol) of 1,3-bis(3-aminophenoxy)benzene and 8.7 g (0.035 mol) of 1,3-bis(3-aminopropyl)-tetramethyldisiloxane were introduced in a nitrogen atmosphere, and this mixture was dissolved in 1,500 g of NMP. Furthermore, this solution was cooled to 0° C., and at this temperature, 239.7 g (1.14 mol) of trimellitic anhydride chloride was added thereto. Stirring was continued for one hour at room temperature, subsequently the temperature was increased to 180° C., and imidization was completed by a reaction for 5 hours. The reaction liquid was introduced into methanol, and a polymer was isolated. This was dried and then dissolved in N-methyl-2-pyrrolidone, the solution was introduced into methanol, and thus the polymer was isolated again. The polymer thus isolated was dried under reduced pressure, and purified polyether amideimide in a powder form was obtained. This was designated as polyether amideimide C.

(Production of Varnish for Adhesive Layer Formation)

22 g of polyether amideimide C and 6.6 g of 3-ureidopropyltriethoxysilane (50% methanol solution) (manufactured by Shin-Etsu Chemical Co., Ltd., trade name: KBE585) were dissolved in 78 g of NMP, and varnish for adhesive layer formation 3A was produced.

22 g of polyether amideimide C and 2.2 g of 3-glycidoxypropyltrimethoxysilane (manufactured by Dow Corning Toray Silicone Co., Ltd., trade name: SH6040) were dissolved in 78 g of NMP, and varnish for adhesive layer formation 3B was produced.

Production of Varnish for Non-Adhesive Layer Formation

Production Example 4

In a 5-liter four-necked flask equipped with a thermometer, a stirrer, a nitrogen inlet tube, and a fractionating column, 172.4 g (0.42 mol) of 2,2-bis[4-(4-aminophenoxy) phenyl]propane and 153.7 g (0.42 mol) of 4,4'-methylenebis (2,6-diisopropylaniline) were introduced, and this mixture was dissolved in 1,550 g of NMP. Furthermore, this solution was cooled to 0° C., and at this temperature, 174.7 g (0.83 mol) of trimellitic anhydride chloride was added thereto. After trimellitic anhydride chloride dissolved, 130 g of triethylamine was added thereto. Stirring was continued for 2 hours at room temperature (25° C.), subsequently the temperature was increased to 180° C., and thus imidization was completed by a reaction for 5 hours. The reaction liquid was introduced into water, and a polymer was isolated. This was dried and then dissolved in NMP, the solution was introduced into water, and the polymer was isolated again. The polymer thus isolated was dried under reduced pressure, and thus purified polyamideimide in a powder form was obtained.

120 g of this polyamideimide powder and 6 g of a silane coupling agent (manufactured by Dow Corning Toray Silicone Co., Ltd., trade name: SH6040) were dissolved in 360 g of NMP, and varnish for adhesive layer formation 4 was obtained.

Production and Evaluation of Temporary Protective Film

Example 1

A polyimide film (UPILEX SGA manufactured by Ube Industries, Ltd.) having a thickness of 50 μm and having the surface subjected to a chemical treatment was used as a support film. On one surface of this polyimide film, varnish for adhesive layer formation 2A was applied to a thickness of 30 μm. The coating film was dried by heating for 10 minutes at 100° C. and for 10 minutes at 300° C., and thereby an adhesive layer having a thickness of 6 μm was formed on one surface of the support film. Thus, a temporary protective film of Example 1 was obtained.

With regard to the temporary protective film of Example 1, the glass transition temperature of the adhesive layer was 155° C., the 5% weight reduction temperature of the adhesive layer was 421° C., and the elastic modulus at 200° C. of the adhesive layer was 8 MPa. The ratio $T_2/T_1$ of the thickness $T_2$ of the adhesive layer with respect to the thickness $T_1$ of the support film was 0.12.

Figure 6:
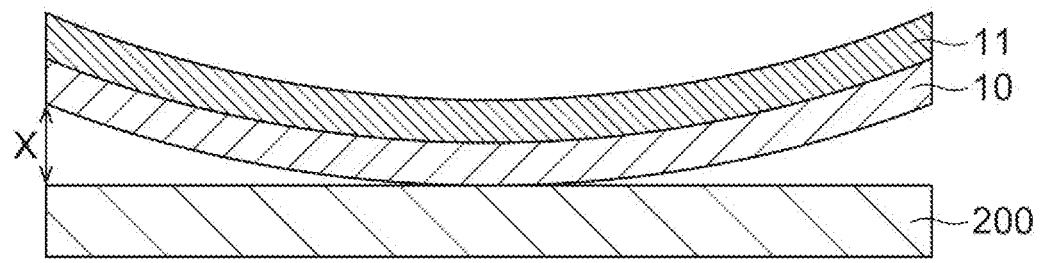
FIG. 6 is a diagram illustrating the measurement points for the warpage of a temporary protective film-attached lead frame.

The temporary protective film of Example 1 was attached to a copper lead frame (50 mm×200 mm, AgCu) under the conditions of a temperature of 230° C., a pressure of 6 MPa, and a time of 10 seconds, and then the 90-degree peel strength (peel strength after attachment) between the adhesive layer and the lead frame at 25° C. was measured (speed of tear-off: 300 mm per minute). As a result, the peel strength after attachment was 50 N/m, and any defect of peeling during conveyance did not occur. Curling of the temporary protective film of Example 1 was slightly significant; however, workability at the time of attachment was satisfactory. Next, warpage of the temporary protective film of Example 1 was measured. FIG. 6 is a schematic diagram illustrating a method for evaluating warpage. As shown in FIG. 6, a temporary protective film-attached lead frame, in which a temporary protective film 10 was attached to a lead frame 11, was mounted on a holder 200, and the warpage (X) in the longitudinal direction of this temporary protective film-attached lead frame was measured. The warpage (X) caused by the temporary protective film of Example 1 was measured, and as a result, the warpage (X) was 1.0 mm.

Adhesion of semiconductor elements, wire bonding, and formation of a sealing layer were carried out using a lead frame having the temporary protective film of Example 1 attached thereto. FIG. 4 shows a schematic diagram of a package thus obtained (temporary protective film-attached sealing molded body). A silver paste was used for the adhesion of the semiconductor elements, and the silver paste was cured by heating for 60 minutes at 180° C. Subsequently, under an assumption of reflow connection, the assembly was heated for 2 minutes at a maximum temperature of 400° C. Wire bonding was carried out using a gold wire as the wire, by heating for 10 minutes at 230° C. In a sealing process of forming a sealing layer, GE-300 (manufactured by Hitachi Chemical Co., Ltd.) was used as a sealing material, and the process was carried out at a temperature of 180° C. and a pressure of 7 MPa for a time of 3 minutes. Subsequently, heating for 5 hours at 180° C. was performed, and the sealing material was cured. Problems did not occur in any of the processes. After the sealing molding, the temporary protective film was torn off (speed of tear-off: 300 mm per minute) from the lead frame and the sealing layer at 180° C., and the 90-degree peel strength (peel strength after sealing) was 390 N/m. At this time, the temporary protective film was easily torn off without having the adhesive layer adhering to or remaining on the lead frame and the sealing layer. The package thus obtained had a structure in which multiple units of the package of FIG. 5 were connected together. Furthermore, this package was divided, and thereby packages each having one semiconductor element as shown in FIG. 5 were produced. However, there was no problem in the process.

Example 2

A polyimide film (UPILEX SGA manufactured by Ube Industries, Ltd.) having a thickness of 25 μm and having the surface subjected to a chemical treatment was used as a support film. On one surface of this polyimide film, varnish for adhesive layer formation 1A was applied to a thickness of 15 μm. The coating film was dried by heating for 10 minutes at 100° C. and for 10 minutes at 300° C., and thereby an adhesive layer having a thickness of 3 μm was formed on one surface of the support film. Thus, a temporary protective film of Example 2 was obtained.

With regard to the temporary protective film of Example 2, the glass transition temperature of the adhesive layer was 230° C., the 5% weight reduction temperature of the adhesive layer was 443° C., and the elastic modulus at 200° C. of the adhesive layer was 1,500 MPa. The ratio $T_2/T_1$ of the thickness $T_2$ of the adhesive layer with respect to the thickness $T_1$ of the support film was 0.12.

The temporary protective film of Example 2 was attached to a copper lead frame (50 mm×200 mm, AgCu) under the conditions of a temperature of 250° C., a pressure of 6 MPa, and a time of 10 seconds, and then the 90-degree peel strength (peel strength after attachment) between the adhesive layer and the lead frame at 25° C. was measured (speed of tear-off 300 mm per minute). As a result, the peel strength after attachment was 20 N/m, and any defect of peeling during conveyance did not occur. Curling of the temporary protective film of Example 2 was slightly significant; however, workability at the time of attachment was satisfactory. Warpage (X) caused by the temporary protective film of Example 2 was measured in the same manner as in Example 1, and as a result, the warpage (X) was 0.8 mm.

Adhesion of semiconductor elements, heating under an assumption of reflow connection, wire bonding, and formation of a sealing layer were carried out in the same manner as in Example 1, using a lead frame having the temporay protective film of Example 2 attached thereto, and a package as illustrated in FIG. 4 was produced. However, there was no problem in any of the processes. After the sealing molding, the temporary protective fihn was torn off (speed of tear-off 300 mm per minute) from the lead frame and the sealing layer at 180° C., and the 90-degree peel strength (peel strength after sealing) was 290 N/m. The temporary protective film was easily torn off without having the adhesive layer adhering to or remaining on the lead frame and the sealing layer. The package thus obtained had a structure in which multiple units of the package of FIG. 5 were connected together. Furthermore, this package was divided, and thereby packages each having one semiconductor element as shown in FIG. 5 were produced. However, there was no problem in the process.

Example 3

A polyimide film (manufactured by Du Pont-Toray Co., Ltd., trade name: KAPTON EN, the coefficient of linear expansion at 20° C. to 200° C. is $1.5 \times 10^{-5}/°$ C., and the heat shrinkage factor when heated for 60 minutes at 200° C. is 0.02%) having a thickness of 25 µm was used as a support film. On one surface of this polyimide film, varnish for adhesive layer formation 3A was applied to a thickness of 25 µm. The coating film was dried by heating for 10 minutes at 100° C. and for 10 minutes at 300° C., and thereby an adhesive layer having a thickness of 5 µm was formed on one surface of the support film. Thus, a temporary protective film of Example 3 was obtained.

For the adhesive layer, the glass transition temperature was 146° C., the 5% weight reduction temperature was 410° C., and the elastic modulus at 200° C. of the adhesive layer was 3.8 MPa. The ratio $T_2/T_1$ of the thickness $T_2$ of the adhesive layer with respect to the thickness $T_1$ of the support film was 0.2.

The temporary protective film of Example 3 was attached to a copper lead frame coated with palladium (50 mm×200 mm, PPF) under the conditions of a temperature of 170° C., a pressure of 6 MPa, and a time of 10 seconds, and then the 90-degree peel strength (peel strength after attachment) between the adhesive layer and the lead frame at 25° C. was measured (speed of tear-off: 300 mm per minute). As a result, the peel strength after attachment was 110 N/m, and any defect of peeling during conveyance did not occur. Curling of the temporary protective film of Example 3 was slightly significant; however, workability at the time of attachment was satisfactory. Warpage (X) caused by the temporary protective film of Example 3 was measured in the same manner as in Example 1, and as a result, the warpage (X) was 0.9 mm.

Adhesion of semiconductor elements, heating under an assumption of reflow connection, wire bonding, and formation of a sealing layer were carried out in the same manner as in Example 1, using a lead frame having the temporary protective film of Example 3 attached thereto, and a package as illustrated in FIG. 4 was produced. However, there was no problem in any of the processes. After the sealing molding, the temporary protective film was torn off (speed of tear-off: 300 mm per minute) from the lead frame and the sealing layer at 180° C., and the 90-degree peel strength (peel strength after sealing) was 370 N/m. The temporary protective film was easily torn off without having the adhesive layer adhering to or remaining on the lead frame and the sealing layer. The package thus obtained had a structure in which multiple units of the package of FIG. 5 were connected together. Furthermore, this package was divided, and thereby packages each having one semiconductor element as shown in FIG. 5 were produced. However, there was no problem in the process.

Example 4

A polyimide film (manufactured by Du Pont-Toray Co., Ltd., trade name: KAPTON EN, the coefficient of linear expansion at 20° C. to 200° C. is $1.5 \times 10^5/°$ C., and the heat shrinkage factor when heated for 60 minutes at 200° C. is 0.02%) having a thickness of 50 µm was used as a support film. On one surface of this polyimide film, varnish for adhesive layer formation 1B was applied to a thickness of 50 µm. The coating film was dried by heating for 10 minutes at 100° C. and for 10 minutes at 300° C., and thereby an adhesive layer having a thickness of 8 µm was formed on one surface of the support film. Thus, a temporary protective film having a two-layer structure was obtained.

The glass transition temperature of the adhesive layer was 230° C., the 5% weight reduction temperature was 421° C., and the elastic modulus at 200° C. of the adhesive layer was 1,500 MPa. The ratio $T_2/T_1$ of the thickness $T_2$ of the adhesive layer with respect to the thickness $T_1$ of the support film was 0.16.

On the surface of the support film on the opposite side of the surface where the adhesive layer was provided, varnish for non-adhesive layer formation 4 produced in Production Example 4 was applied to a thickness of 50 µm. The coating film was dried by heating for 10 minutes at 100° C. and for 10 minutes at 300° C., and thereby a non-adhesive layer having a thickness of 8 µm was formed on one surface of the support film. The glass transition temperature of this non-adhesive layer was 253° C., the 5% weight reduction temperature was 416° C., and the elastic modulus at 200° C. was 1,700 MPa. Thereby, a temporary protective film of Example 4, in which an adhesive layer and a non-adhesive layer were respectively formed on each of the two surfaces of the support film as shown in FIG. 2, was obtained.

The temporary protective film of Example 4 was attached to a copper lead frame coated with palladium (50 mm×200 mm, PPF) under the conditions of a temperature of 250° C., a pressure of 6 MPa, and a time of 10 seconds, and then the 90-degree peel strength (peel strength after attachment) between the adhesive layer and the lead frame at 25° C. was measured (speed of tear-off: 300 mm per minute). As a result, the peel strength after attachment was 40 N/n, and any defect of peeling during conveyance did not occur. The surface of the non-adhesive layer of the temporary protective film of Example 4 was attached to a metal plate made of brass under the conditions of 250° C., a pressure of 6 MPa, and a time of 10 seconds, and the 90-degree peel strength between the non-adhesive layer and the metal plate made of brass at 25° C. was measured. The peel strength was 0 N/m, and any defect of attaching to the mold or jigs during the process did not occur. Curling of the temporary protective film of Example 4 was negligible, and workability at the time of attachment was satisfactory. Next, warpage (X) caused by the temporary protective film of Example 4 was measured in the same manner as in Example 1, and as a result, the warpage (X) was 0.2 mm.

Adhesion of semiconductor elements, heating under an assumption of reflow connection, wire bonding, and formation of a sealing layer were carried out in the same manner as in Example 1, using a lead frame having the temporary protective film of Example 4 attached thereto, and a package as illustrated in FIG. 4 was produced. However, there was no problem in any of the processes. After the sealing molding, the temporary protective film was torn off from the lead frame and the sealing layer at 180° C., and the 90-degree peel strength (peel strength after sealing) was 420 N/m. The temporary protective film was easily torn off without having the adhesive layer adhering to or remaining on the lead frame and the sealing layer. Furthermore, this package was divided, and thereby packages each having one semiconductor element as shown in FIG. 5 were produced. However, there was no problem in the process.

Example 5

A polyimide film (manufactured by Du Pont-Toray Co., Ltd., trade name: KAPTON EN, the coefficient of linear expansion at 20° C. to 200° C. is $1.5 \times 10^{-5}$/° C., and the heat shrinkage factor when heated for 60 minutes at 200° C. is 0.02%) having a thickness of 25 μm was used as a support film. On one surface of this polyimide film, varnish for adhesive layer formation 2B was applied to a thickness of 15 μm. The coating film was dried by heating for 10 minutes at 100° C. and for 10 minutes at 300° C., and thereby an adhesive layer having a thickness of 3 μm was formed on one surface of the support film. Thus, a temporary protective film having a two-layer structure was obtained.

For the adhesive layer, the glass transition temperature was 155° C., the 5% weight reduction temperature was 415° C., and the elastic modulus at 200° C. of the adhesive layer was 8 MPa. The ratio $T_2/T_1$, of the thickness $T_2$ of the adhesive layer with respect to the thickness $T_1$ of the support film was 0.12.

On the surface of the support film on the opposite side of the surface where the adhesive layer was provided, varnish for non-adhesive layer formation 4 produced in Production Example 4 was applied to a thickness of 10 μm. The coating film was dried by heating for 10 minutes at 100° C. and for 10 minutes at 300° C., and thereby a non-adhesive layer having a thickness of 2 μm was formed on one surface of the support film. The glass transition temperature of this non-adhesive layer was 253° C., the 5% weight reduction temperature was 416° C., and the elastic modulus at 200° C. was 1,700 MPa. Thereby, a temporary protective film of Example 5, in which an adhesive layer and a non-adhesive layer were respectively formed on each of the two surfaces of the support film as shown in FIG. 2, was obtained.

The temporary protective film of Example 5 was attached to a copper lead frame (50 mm×200 mm, AgCu) under the conditions of a temperature of 230° C., a pressure of 6 MPa, and a time of 10 seconds, and then the 90-degree peel strength (peel strength after attachment) between the adhesive layer and the lead frame at 25° C. was measured. As a result, the peel strength after attachment was 70 N/m, and any defect of peeling during conveyance did not occur. The surface of the non-adhesive layer of the temporary protective film of Example 5 was attached to a metal plate made of brass under the conditions of 250° C., a pressure of 6 MPa, and a time of 10 seconds, and the 90-degree peel strength between the non-adhesive layer and the metal plate made of brass at 25° C. was measured. The peel strength was 0 N/m, and any defect of attaching to the mold or jigs during the process did not occur. Curling of the temporary protective film of Example 5 was negligible, and workability at the time of attachment was satisfactory. Next, warpage (X) caused by the temporary protective film of Example 5 was measured in the same manner as in Example 1, and as a result, the warpage (X) was 0.1 mm.

Adhesion of semiconductor elements, heating under an assumption of reflow connection, wire bonding, and formation of a sealing layer were carried out in the same manner as in Example 1, using a lead frame having the temporary protective film of Example 5 attached thereto, and a package as illustrated in FIG. 4 was produced. However, there was no problem in any of the processes. After the sealing molding, the temporary protective film was torn off from the lead frame and the sealing layer at 180° C., and the 90-degree peel strength (peel strength after sealing) was 460 N/n. The temporary protective film was easily torn off without having the adhesive layer adhering to or remaining on the lead frame and the sealing layer. Furthermore, this package was divided, and thereby packages each having one semiconductor element as shown in FIG. 5 were produced. However, there was no problem in the process.

Example 6

A polyimide film (manufactured by Du Pont-Toray Co., Ltd., trade name: KAPTON EN, the coefficient of linear expansion at 20° C. to 200° C. is $1.5 \times 10^{-5}$/° C., and the heat shrinkage factor when heated for 60 minutes at 200° C. is 0.02%) having a thickness of 25 μm was used as a support film. On one surface of this polyimide film, varnish for adhesive layer formation 3B was applied to a thickness of 10 μm. The coating film was dried by heating for 10 minutes at 100° C. and for 10 minutes at 300° C., and thereby an adhesive layer having a thickness of 2 μm was formed on one surface of the support film. Thus, a temporary protective film of Example 6 was obtained.

For the adhesive layer, the glass transition temperature was 146° C., the 5% weight reduction temperature was 409° C., and the elastic modulus at 200° C. of the adhesive layer was 3.8 MPa. The ratio $T_2/T_1$ of the thickness $T_2$ of the adhesive layer with respect to the thickness $T_1$ of the support film was 0.08.

The temporary protective film of Example 6 was attached to a copper lead frame coated with palladium (50 mm×200 mm, PPF) under the conditions of a temperature of 170° C., a pressure of 6 MPa, and a time of 10 seconds, and then the 90-degree peel strength (peel strength after attachment) between the adhesive layer and the lead frame at 25° C. was measured. As a result, the peel strength after attachment was 90 N/m, and any defect of peeling during conveyance did not occur.

Curling of the temporary protective film of Example 6 was negligible, and workability at the time of attachment was satisfactory. Next, warpage (X) caused by the temporary protective film of Example 6 was measured in the same manner as in Example 1, and as a result, the warpage (X) was 0.3 mm.

Adhesion of semiconductor elements, heating under an assumption of reflow connection, wire bonding, and formation of a sealing layer were carried out in the same manner as in Example 1, using a lead frame having the temporary protective film of Example 6 attached thereto, and a package as illustrated in FIG. 4 was produced. However, there was no problem in any of the processes. After the sealing molding, the temporary protective film was torn off from the lead frame and the sealing layer at 180° C. (speed of tear-off: 300 mm per minute), and the 90-degree peel strength (peel strength after sealing) was 310 N/m. The temporary protective film was easily torn off without having the adhesive layer adhering to or remaining on the lead frame and the sealing layer. The package thus obtained had a structure in which multiple units of the package of FIG. 5 were connected together. Furthermore, this package was divided, and thereby packages each having one semiconductor element as shown in FIG. 5 were produced. However, there was no problem in the process.

Example 7

A polyimide film (manufactured by Du Pont-Toray Co., Ltd., trade name: KAPTON EN, the coefficient of linear expansion at 20° C. to 200° C. is $1.5 \times 10^{-5}/°$ C., and the heat shrinkage factor when heated for 60 minutes at 200° C. is 0.02%) having a thickness of 25 μm was used as a support film. On one surface of this polyimide film, varnish for adhesive layer formation 1D was applied to a thickness of 5 μm. The coating film was dried by heating for 10 minutes at 100° C. and for 10 minutes at 180° C., and thereby an adhesive layer having a thickness of 1 μm was formed on one surface of the support film. Thus, a temporary protective film of Example 7 was obtained.

For the adhesive layer, the glass transition temperature was 230° C., the 5% weight reduction temperature was 435° C., and the elastic modulus at 200° C. of the adhesive layer was 1,500 MPa. The ratio $T_2/T_1$ of the thickness $T_2$ of the adhesive layer with respect to the thickness $T_1$ of the support film was 0.04.

The temporary protective film of Example 7 was attached to a copper lead frame coated with palladium (50 mm×200 mm, PPF) under the conditions of a temperature of 20q° C., a pressure of 6 MPa, and a time of 10 seconds, and then the 90-degree peel strength (peel strength after attachment) between the adhesive layer and the lead frame at 25° C. was measured. As a result, the peel strength was 100 N/m, and any defect of peeling during conveyance did not occur.

Curling of the temporary protective film of Example 7 was negligible, and workability at the time of attachment was satisfactory. Next, warpage (X) caused by the temporary protective film of Example 7 was measured in the same manner as in Example 1, and as a result, the warpage (X) was 0.2 mm.

Adhesion of semiconductor elements, heating under an assumption of reflow connection, wire bonding, and formation of a sealing layer were carried out in the same manner as in Example 1, using a lead frame having the temporary protective film of Example 7 attached thereto, and a package as illustrated in FIG. 4 was produced. However, there was no problem in any of the processes. After the sealing molding, the temporary protective film was torn off from the lead frame and the sealing layer at 180° C. (speed of tear-off: 300 mm per minute), and the 90-degree peel strength (peel strength after sealing) was 430 N/m. The temporary protective film was easily torn off without having the adhesive layer adhering to or remaining on the lead frame and the sealing layer. The package thus obtained had a structure in which multiple units of the package of FIG. 5 were connected together. Furthermore, this package was divided, and thereby packages each having one semiconductor element as shown in FIG. 5 were produced. However, there was no problem in the process.

Comparative Example 1

A polyimide film (manufactured by Du Pont-Toray Co., Ltd., trade name: KAPTON EN, the coefficient of linear expansion at 20° C. to 200° C. is $1.5 \times 10^{-5}/°$ C., and the heat shrinkage factor when heated for 60 minutes at 200° C. is 0.02%) having a thickness of 50 μm was used as a support film. On one surface of this polyimide film, varnish for adhesive layer formation 1C was applied to a thickness of 100 μm. The coating film was dried by heating for 10 minutes at 100° C. and for 10 minutes at 300° C., and thereby an adhesive layer having a thickness of 20 μm was formed on one surface of the support film. Thus, a temporary protective film of Comparative Example 1 having the configuration of FIG. 1 was obtained.

For the adhesive layer, the glass transition temperature was 230° C., the 5% weight reduction temperature was 452° C., and the elastic modulus at 200° C. of the adhesive layer was 1,500 MPa. The ratio $T_2/T_1$ of the thickness $T_2$ of the adhesive layer with respect to the thickness $T_1$ of the support film was 0.4.

Next, on the surface of the support film on the opposite side of the surface where an adhesive layer was provided, varnish for non-adhesive layer formation 4 produced in Production Example 4 was applied to a thickness of 95 μm. The coating film was dried by heating for 10 minutes at 100° C. and for 10 minutes at 300° C., and thus a non-adhesive layer having a thickness of 15 μm was formed on one surface of the support film.

The glass transition temperature of this non-adhesive layer was 253° C., the 5% weight reduction temperature was 416° C., and the elastic modulus at 200° C. was 1,700 MPa. Thereby, a temporary protective film of Comparative Example 1, in which an adhesive layer and a non-adhesive layer were respectively formed on each of two surfaces of the support film as shown in FIG. 2, was obtained.

The temporary protective film of Comparative Example 1 was attached to a copper lead frame coated with palladium (50 mm×200 mm, PPF) under the conditions of a temperature of 230° C., a pressure of 6 MPa, and a time of 10 seconds, and then the 90-degree peel strength (peel strength after attachment) between the adhesive layer and the lead frame at 25° C. was measured (speed of tear-off: 300 mm per minute). As a result, the peel strength after attachment was 15 N/m, and any defect of peeling during conveyance did not occur. The surface of the non-adhesive layer of the temporary protective film of Comparative Example 1 was attached to a metal plate made of brass at 250° C. and a pressure of 6 MPa for a time of 10 seconds, and the 90-degree peel strength between the non-adhesive layer and the metal plate made of brass at 25° C. was measured. The peel strength was 0 N/m, and any defect of attaching to the mold or jigs during the process did not occur.

Curling of the temporary protective film of Comparative Example 1 was negligible, and workability at the time of attachment was satisfactory. Next, warpage (X) caused by the temporary protective film of Comparative Example 1 was measured in the same manner as in Example 1, and as a result, it was 0.2 mm.

Adhesion of semiconductor elements, heating under an assumption of reflow connection, wire bonding, and formation of a sealing layer were carried out in the same manner as in Example 1, using a lead frame having the temporary protective film of Comparative Example 1 attached thereto, and a package as illustrated in FIG. 4 was produced. However, there was no problem in any of the processes. After the sealing molding, attempts were made to tear off the temporary protective film from the lead frame and the sealing layer at 180° C., and since the adhesive strength between the adhesive layer and the lead frame as well as the sealing material was too strong, the film was ruptured and thus could not be torn off. The 90-degree peel strength at 180° between the adhesive layer and the lead frame as well as the sealing material could not be measured because the film was ruptured, and the peel strength at break (peel strength after sealing) was 2,000 N/m.

Comparative Example 2

A polyimide film (UPILEX SGA manufactured by Ube Industries, Ltd.) having a thickness of 25 μm and having the surface subjected to a chemical treatment was used as a support film. On one surface of this polyimide film, varnish for adhesive layer formation 2C was applied to a thickness of 50 μm. The coating film was dried by heating for 10 minutes at 100° C. and for 10 minutes at 300° C., and thereby an adhesive layer having a thickness of 10 μm was formed on one surface of the support film. Thus, a temporary protective film of Comparative Example 2 having the configuration of FIG. 1 was obtained.

For the adhesive layer, the glass transition temperature was 155° C., the 5% weight reduction temperature was 421° C., and the elastic modulus at 200° C. of the adhesive layer was 8 MPa. The ratio $T_2/T_1$ of the thickness $T_2$ of the adhesive layer with respect to the thickness $T_1$ of the support film was 0.4.

On the surface of the support film on the opposite side of the surface where an adhesive layer was provided, varnish for non-adhesive layer formation 4 produced in Production Example 4 was applied to a thickness of 40 μm. The coating film was dried by heating for 10 minutes at 100° C. and for 10 minutes at 300° C., and thus a non-adhesive layer having a thickness of 7 μm was formed on one surface of the support film.

The glass transition temperature of this non-adhesive layer was 253° C., the 5% weight reduction temperature was 416° C., and the elastic modulus at 200° C. was 1,700 MPa. Thereby, a temporary protective film of Comparative Example 2, in which an adhesive layer and a non-adhesive layer were respectively formed on each of two surfaces of the support film as shown in FIG. 6, was obtained.

The temporary protective film of Comparative Example 2 was attached to a copper lead frame (50 mm×200 mm, AgCu) under the conditions of a temperature of 210° C., a pressure of 6 MPa, and a time of 10 seconds, and then the 90-degree peel strength (peel strength after attachment) between the adhesive layer and the lead frame at 25° C. was measured (speed of tear-off: 300 mm per minute). As a result, the peel strength after attachment was 150 N/m, and any defect of peeling during conveyance did not occur.

The surface of the non-adhesive layer of the temporary protective film of Comparative Example 2 was attached to a metal plate made of brass under the conditions of 250° C., a pressure of 6 MPa, and a time of 10 seconds, and the 90-degree peel strength between the non-adhesive layer and the metal plate made of brass at 25° C. was measured. The peel strength was 0 N/m, and any defect of attaching to the mold or jigs during the process did not occur.

Curling of the temporary protective film of Comparative Example 2 was negligible, and workability at the time of attachment was satisfactory. Next, warpage (X) caused by the temporary protective film of Comparative Example 2 was measured in the same manner as in Example 1, and as a result, it was 0.1 mm.

Adhesion of semiconductor elements, heating under an assumption of reflow connection, wire bonding, and formation of a sealing layer were carried out in the same manner as in Example 1, using a lead frame having the temporary protective film of Comparative Example 2 attached thereto, and a package as illustrated in FIG. 4 was produced. However, there was no problem in any of the processes. After the sealing molding, the temporary protective film was torn off from the lead frame and the sealing layer at 180° C. (speed of tear-off: 300 mm per minute), and the 90-degree peel strength (peel strength after sealing) was 900 N/m. The tape was damaged in the middle of peeling.

Comparative Example 3

A polyimide film (manufactured by Du Pont Toray Co., Ltd., trade name: CAPTON EN, the coefficient of linear expansion at 20° C. to 200° C. is $1.5 \times 10^{-5}/°$ C., and the heat shrinkage factor when heated for 60 minutes at 200° C. is 0.02%) having a thickness of 25 μm and having the surface subjected to a chemical treatment was used as a support film. On one surface of this polyimide film, varnish for adhesive layer formation 2D was applied to a thickness of 25 μm. The coating film was dried by heating for 10 minutes at 100° C. and for 10 minutes at 300° C., and thereby an adhesive layer having a thickness of 10 μm was formed on one surface of the support film. Thus, a temporary protective film of Comparative Example 3 having the configuration of FIG. 1 was obtained.

For the adhesive layer, the glass transition temperature was 155° C., the 5% weight reduction temperature was 421° C., and the elastic modulus at 200° C. of the adhesive layer was 8 MPa. The ratio $T_2/T_1$ of the thickness $T_2$ of the adhesive layer with respect to the thickness $T_1$ of the support film was 0.4.

On the surface of the support film on the opposite side of the surface where an adhesive layer was provided, varnish for non-adhesive layer formation 4 produced in Production Example 4 was applied to a thickness of 40 μm. The coating film was dried by heating for 10 minutes at 100° C. and for 10 minutes at 300° C., and thus a non-adhesive layer having a thickness of 7 μm was formed on one surface of the support film.

The glass transition temperature of this non-adhesive layer was 253° C., the 5% weight reduction temperature was 416° C., and the elastic modulus at 200° C. was 1,700 MPa. Thereby, a temporary protective film of Comparative Example 3, in which an adhesive layer and a non-adhesive layer were respectively formed on each of two surfaces of the support film as shown in FIG. 6, was obtained.

The temporary protective film of Comparative Example 3 was attached to a copper lead flame coated with palladium (50 mm×200 mm, PPF) under the conditions of a temperature of 250° C., a pressure of 8 MPa, and a time of 10 seconds and the 90-degree peel strength (peel strength after attachment) between the adhesive layer and the lead frame at 25° C. was measured (speed of tear-off: 300 mm per minute). As a result, the peel strength after attachment was 500 N/m, and any defect of peeling during conveyance did not occur.

The surface of the non-adhesive layer of the temporary protective film of Comparative Example 3 was attached to a metal plate made of brass under the conditions of 250° C., a pressure of 6 MPa, and a time of 10 seconds, and the 90-degree peel strength between the non-adhesive layer and the metal plate made of brass at 25° C. was measured. The peel strength was 0 N/m, and any defect of attaching to the mold or jigs during the process did not occur.

Curling of the temporary protective film of Comparative Example 3 was negligible, and workability at the time of attachment was satisfactory. Next, warpage (X) caused by the temporary protective film of Comparative Example 3 was measured in the same manner as in Example 1, and as a result, it was 0.1 mm.

Adhesion of semiconductor elements, heating under an assumption of reflow connection, wire bonding, and formation of a sealing layer were carried out in the same manner as in Example 1, using a lead frame having the temporary protective film of Comparative Example 3 attached thereto, and a package as illustrated in FIG. 4 was produced. However, there was no problem in any of the processes. After the sealing molding, the temporary protective film was torn off from the lead frame and the sealing layer at 180° C. (speed of tear-off: 300 mm per minute), and the 90-degree peel strength (peel strength after sealing) was 800 N/m. The tape was damaged in the middle of peeling.

The temporary protective films of Examples 1 to 6 could be easily peeled off at 180° C. from the lead frame and the sealing layer. It was found that by using the temporary protective films of Examples 1 to 6, semiconductor packages can be produced with high workability and productivity. Since the temporary protective films of Examples 1 to 6 have high tight adhesiveness to lead frames at 25° C., and can be easily torn off from a lead frame and a sealing layer at 180° C. even after being sealed with a resin through a process of reflow connection at a maximum temperature of 400° C., production of semiconductor packages with high workability and productivity is enabled. In contrast, the temporary protective films of Comparative Examples 1, 2, and 3, in which the 90-degree peel strength at 180° C. between an adhesive layer and a lead frame as well as a sealing material after a temporary protective film-attached lead frame is sealed with a sealing material is more than 600 N/m, have too strong adhesive strength between the adhesive layer and the lead frame as well as the sealing material. Therefore, the film was ruptured and could not be torn off.

TABLE 1

| | Support film | | Adhesive layer | | | | | | Non-adhesive layer | | | |
|---|---|---|---|---|---|---|---|---|---|---|---|---|
| | Product name | Film thickness (μm) | Varnish | Additive (mass %) | Film thickness (μm) | Tg (° C.) | 5% weight reduction temperature (° C.) | $T_2/T_1$ thickness ratio | Varnish | Film thickness (μm) | Tg (° C.) | 5% weight reduction temperature (° C.) |
| Example 1 | SGA | 50 | 2A | KBM-903 (10%) | 6 | 155 | 421 | 0.12 | — | — | — | — |
| Example 2 | SGA | 25 | 1A | KBM-603 (10%) | 3 | 230 | 443 | 0.12 | — | — | — | — |
| Example 3 | EN | 25 | 3A | KBE-585 (15%) | 5 | 146 | 410 | 0.20 | — | — | — | — |
| Example 4 | EN | 50 | 1B | KBE-9007 (20%) | 8 | 230 | 421 | 0.16 | 4 | 8 | 253 | 416 |
| Example 5 | EN | 25 | 2B | KBM-602 (10%) | 3 | 155 | 415 | 0.12 | 4 | 3 | 253 | 416 |
| Example 6 | EN | 25 | 3B | SH-6040 (10%) | 2 | 146 | 409 | 0.08 | — | — | — | — |
| Example 7 | EN | 25 | 1D | SH-6040 (30%) | 1 | 230 | 435 | 0.04 | — | — | — | — |
| Comparative Example 1 | EN | 50 | 1C | — | 20 | 230 | 452 | 0.40 | 4 | 15 | 253 | 416 |
| Comparative Example 2 | SGA | 25 | 2C | — | 10 | 155 | 421 | 0.40 | 4 | 7 | 253 | 416 |
| Comparative Example 3 | EN | 25 | 2D | SH-6040 (3%) | 10 | 155 | 421 | 0.40 | 4 | 7 | 253 | 416 |

TABLE 2

| | | | After attachment | | After sealing | |
|---|---|---|---|---|---|---|
| | Conditions for attachment | Adherend | Peel strength [N/m] | Peeling temperature [° C.] | Peel strength [N/m] | Peeling temperature [° C.] |
| Example 1 | 230° C./6 MPa/10 s | AgCu | 50 | 25 | 390 | 180 |
| Example 2 | 250° C./6 MPa/10 s | AgCu | 20 | 25 | 290 | 180 |
| Example 3 | 170° C./6 MPa/10 s | PPF | 110 | 25 | 370 | 180 |
| Example 4 | 250° C./6 MPa/10 s | PPF | 40 | 25 | 420 | 180 |
| Example 5 | 230° C./6 MPa/10 s | AgCu | 70 | 25 | 460 | 180 |
| Example 6 | 170° C./6 MPa/10 s | PPF | 90 | 25 | 310 | 180 |
| Example 7 | 230° C./6 MPa/10 s | PPF | 100 | 25 | 430 | 180 |
| Comparative Example 1 | 230° C./6 MPa/10 s | PPF | 15 | 25 | 2000 | 180 |
| Comparative Example 2 | 210° C./6 MPa/10 s | AgCu | 150 | 25 | 900 | 180 |
| Comparative Example 3 | 250° C./8 MPa/10 s | PPF | 500 | 25 | 800 | 180 |

REFERENCE SINGS LIST

1: support film, 2: adhesive layer, 3: non-adhesive layer, 10, 10': temporary protective film, 11: lead frame, 11a: die pad, 11b: inner lead, 12: wire, 13: sealing layer, 14: semiconductor element, 20: sealing molded body, 30: reel body, 31: winding core, 32: side plate, 40: packaging bag, 50: package, 60: packing box, 70: packing material, 100: semiconductor device.

The invention claimed is:

1. A reel body, comprising a winding core and a temporary protective film for semiconductor sealing molding to temporarily protect a lead frame during sealing molding of forming a sealing layer that seals a semiconductor element mounted on the lead frame wound around the winding core, wherein the temporary protective film for semiconductor sealing molding comprises:
a support film; and
an adhesive layer provided on one surface or both surfaces of the support film and containing a resin,
wherein when the temporary protective film is attached to a lead frame having a die pad and an inner lead such that the adhesive layer comes into contact with the lead frame, a 90-degree peel strength between the adhesive layer and the lead frame is 5 N/m or higher at 25° C., and
when the temporary protective film is attached to the lead frame such that the adhesive layer comes into contact with the lead frame, a semiconductor element is mounted on a surface of the die pad, the surface being on the opposite side of the temporary protective film, subsequently the semiconductor element, the lead frame, and the temporary protective film are heated, and then a sealing layer for sealing the semiconductor element while being in contact with the adhesive layer is formed, a 90-degree peel strength between the adhesive layer and the lead frame as well as the sealing layer is 600 N/m or less at 180° C.

2. The reel body according to claim 1,
wherein the adhesive layer further contains a silane coupling agent, and
a content of the silane coupling agent is more than 5% by mass and less than or equal to 35% by mass with respect to the total amount of the resin.

3. The reel body according to claim 1, wherein a glass transition temperature of the adhesive layer is 100° C. to 300° C.

4. The reel body according to claim 1, wherein the resin is a thermoplastic resin having an amide group, an ester group, an imide group, an ether group, or a sulfone group.

5. The reel body according to claim 1, wherein an elastic modulus at 200° C. of the adhesive layer is 1 MPa or higher.

6. The reel body according to claim 1, wherein a ratio of a thickness of the adhesive layer with respect to a thickness of the support film is 0.5 or less.

7. The reel body according to claim 1, wherein a thickness of the adhesive layer is 1 to 20 μm.

8. The reel body according to claim 1, wherein the support film is a film of a polymer selected from the group consisting of an aromatic polyimide, an aromatic polyamide, an aromatic polyamideimide, an aromatic polysulfone, an aromatic polyethersulfone, polyphenylene sulfide, an aromatic polyether ketone, polyallylate, an aromatic polyether ether ketone, and polyethylene naphthalate.

9. The reel body according to claim 1, wherein a glass transition temperature of the support film is 200° C. or higher.

10. The reel body according to claim 1, wherein a thickness of the support film is 5 to 100 μm.

11. The reel body according to claim 1, wherein a coefficient of linear expansion at 20° C. to 200° C. of the support film is $3.0 \times 10^{-5}$ or less.

12. The reel body according to claim 1, wherein a shrinkage factor of the support film when heated for 60 minutes at 200° C. is 0.15% or less.

13. The reel body according to claim 1,
wherein the adhesive layer is provided on one surface of the support film, and
the temporary protective film further includes a non-adhesive layer provided on a surface of the support film, the surface being on the opposite side of the surface provided with the adhesive layer.

14. A package, comprising the reel body according to claim 1; and a packaging bag accommodating the reel body.

15. The reel body according to claim 2,
wherein the silane coupling agent is represented by the following Formula (I):

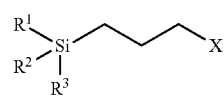

(I)

in the formula, $R^1$, $R^2$, and $R^3$ each independently represent an alkoxy group having 1 to 3 carbon atoms, an alkyl group having 1 to 6 carbon atoms, or an aryl group having 6 to 12 carbon atoms; X is represented by the following Formula (IIa), (IIb), (IIc), (IId), or (IIe):

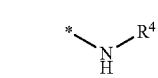

(IIa)

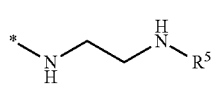

(IIb)

(IIc)

(IId)

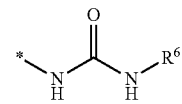

(IIe)

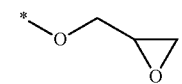

in these formulae, $R^4$, $R^5$, and $R^6$ each independently represent an alkyl group having 1 to 6 carbon atoms, an aryl group having 6 to 12 carbon atoms, or a hydrogen atom; and the symbol * represents a site of bonding to a carbon atom.

16. A packing material, comprising the package according to claim 14; and a packing box accommodating the package.